United States Patent [19]

Taguchi et al.

[11] Patent Number: 5,347,485
[45] Date of Patent: Sep. 13, 1994

[54] MAGNETIC THIN FILM MEMORY

[75] Inventors: Motohisa Taguchi; Tatsuya Fukami; Kazuo Hashima; Yukari Toide; Yuji Kawano; Yoshio Fujii; Takashi Tokunaga; Yoshiyuki Nakaki; Kazuhiko Tsutsumi; Hiroshi Kobayashi; Yuzou Ohdoi; Shinji Tanabe; Hiroshi Shibata, all of Amagasaki, Japan

[73] Assignee: Mitsubishi Denki Kabushiki Kaisha, Tokyo, Japan

[21] Appl. No.: 25,250

[22] Filed: Mar. 2, 1993

[30] Foreign Application Priority Data

Mar. 3, 1992 [JP] Japan .................... 4-045603
Mar. 19, 1992 [JP] Japan .................... 4-063208

[51] Int. Cl.$^5$ ............................................. G11C 11/15
[52] U.S. Cl. ........................................ 365/171; 365/173
[58] Field of Search ...................... 365/170, 171, 173

[56] References Cited

U.S. PATENT DOCUMENTS

| | | | |
|---|---|---|---|
| 3,521,252 | 7/1970 | Oshima et al. | 365/173 |
| 4,897,288 | 6/1990 | Jenson | 365/173 X |
| 5,173,873 | 12/1992 | Wu et al. | 365/173 |

FOREIGN PATENT DOCUMENTS 720985 11/1965 Canada ...................... 365/171

OTHER PUBLICATIONS

A. V. Pohm et al., "Analysis of M-R Elements for $10^8$ BIT/cm$^2$ Arrays", *IEEE Transactions on Magnetics*, vol. 25, No. 5, Sep. 1989, pp. 4266-4268.

G. B. Granley et al., "Properties of 1.4×2.8 μm$^2$ Active Area M-R Elements", *IEEE Transactions on Magnetics*, vol. 27, No. 6, Nov. 1991, pp. 5517-5519.

*Primary Examiner*—Joseph A. Popek
*Attorney, Agent, or Firm*—Burns, Doane, Swecker & Mathis

[57] ABSTRACT

A magnetic thin film memory wherein the memory is composed of magnetic thin films with a layer of a higher coercive force and a layer of a lower coercive force via a nonmagnetic layer laminated repetitively, or magnetic thin films having the easy magnetization axis which lies between the perpendicular and the horizontal directions of the magnetic thin film, and information is recorded on the layer of a lower coercive force, or information is recorded by changing the direction of the magnetization by means of a magnetic field applied by two recording lines which cross the magnetic thin film, thereby to obtain a sufficient amplitude of reproduction signal even when the size of the memory is reduced.

19 Claims, 51 Drawing Sheets

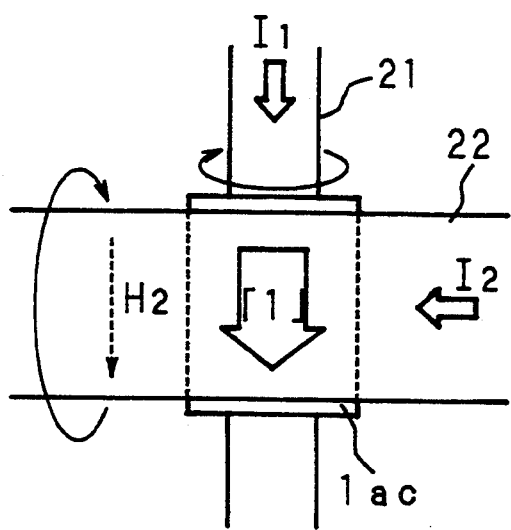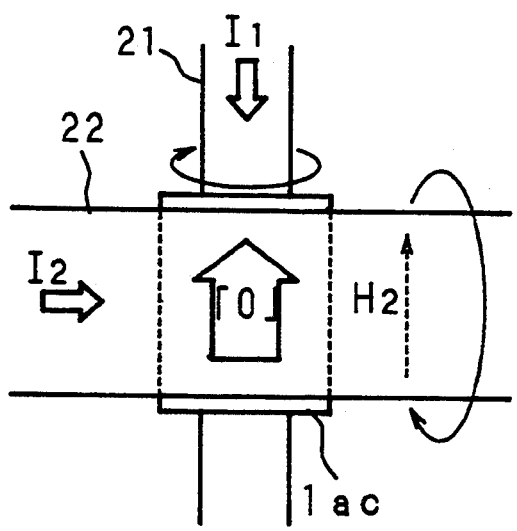

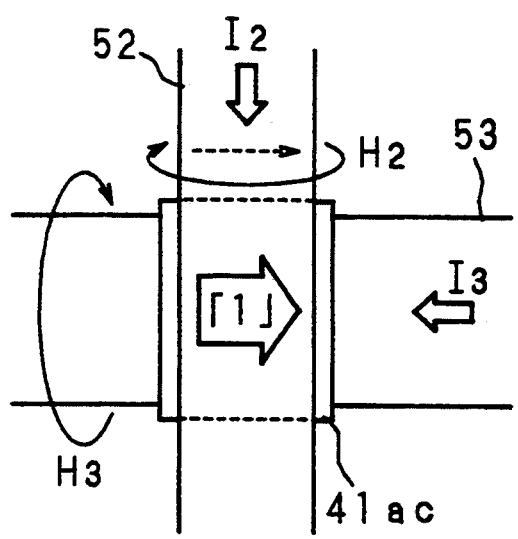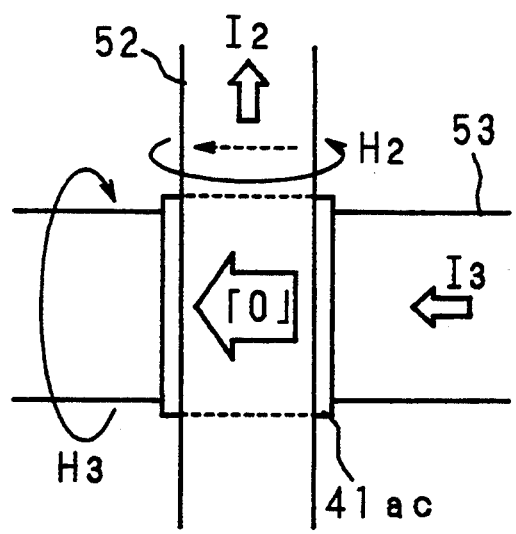

Fig. 10(a)
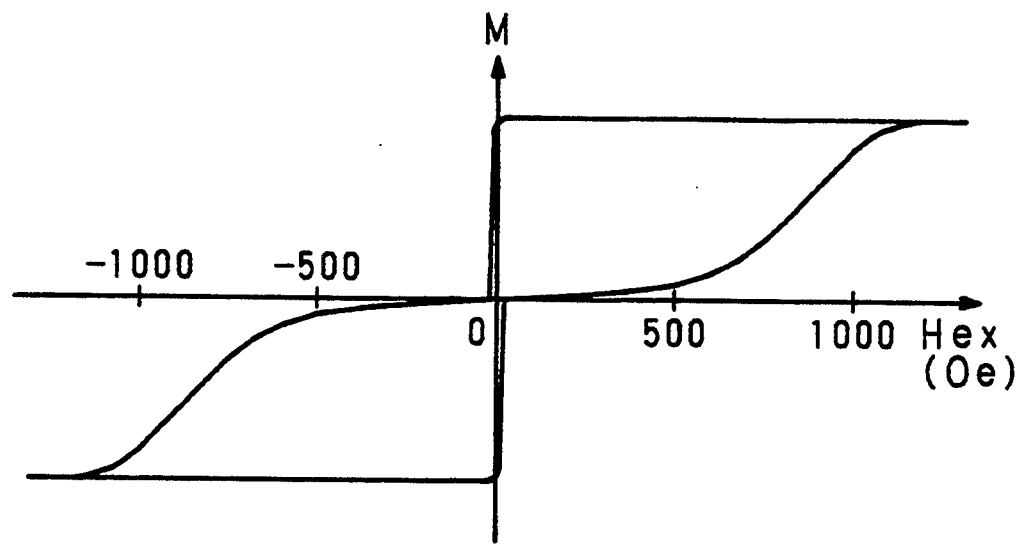
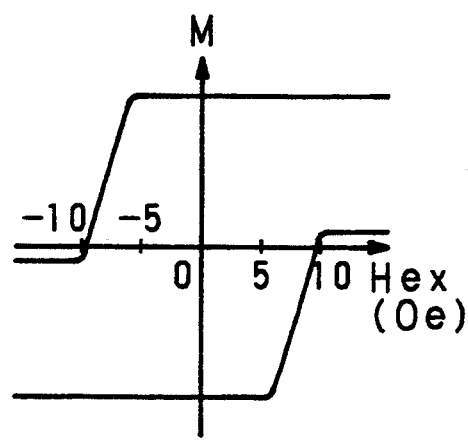
Fig. 10(b)

Fig. 24a
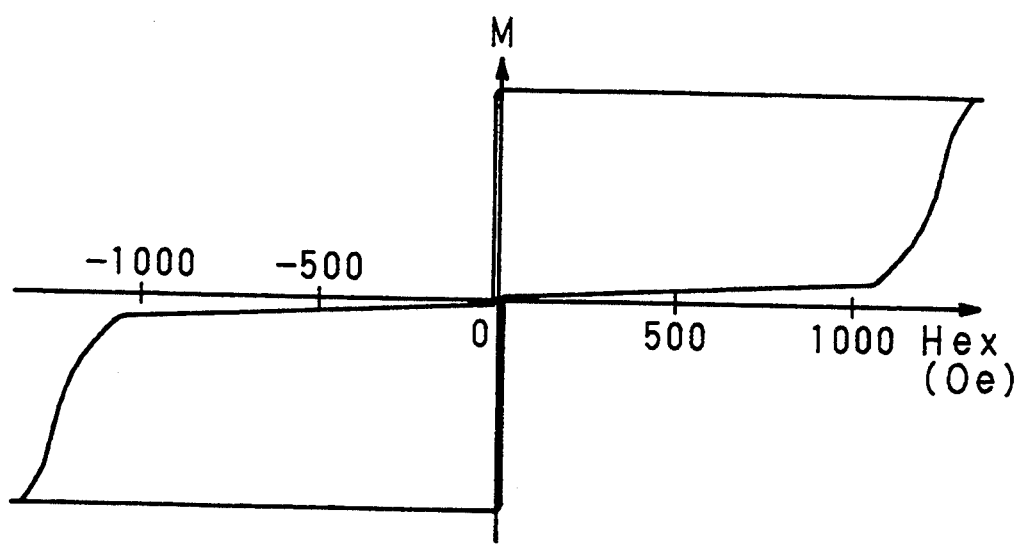
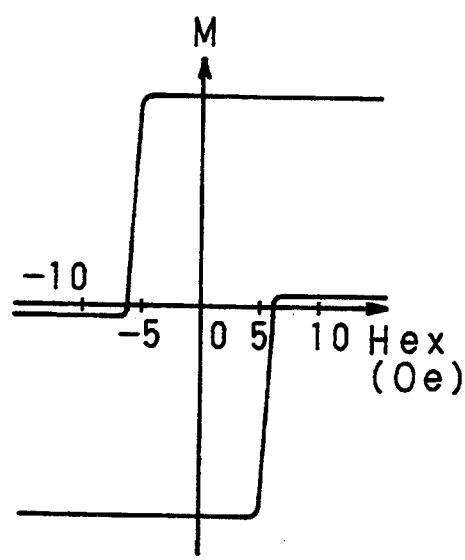
Fig. 24b

Fig. 25a
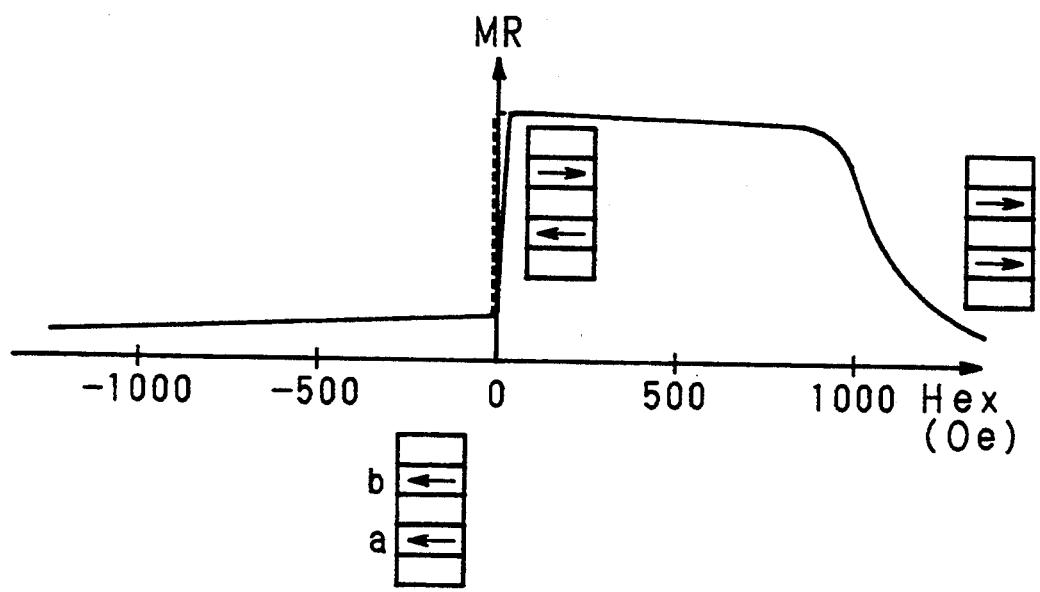
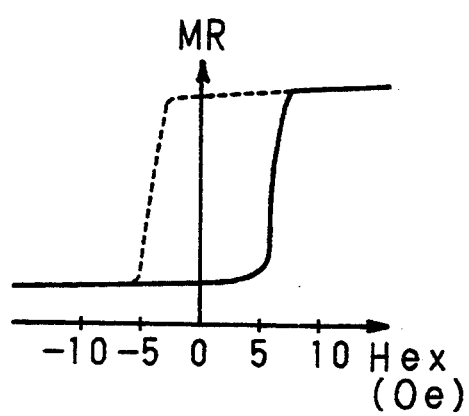
Fig. 25b

MAGNETIC THIN FILM MEMORY

BACKGROUND OF THE INVENTION

1. Field of the Invention

This invention relates to a memory which employs a magnetic thin film.

2. Description of the Related Art

FIG. 1 is a diagram of a conventional magnetic thin film memory device disclosed in "Magnetic Thin Film Engineering" (p. 254, Magnetic Engineering Lecture 5; Maruzen Co., Ltd., 1977).

An example of how to manufacture the memory element will be discussed in the first place. A mask with rectangular holes is brought in tight contact with a smooth glass substrate G, onto which a vacuum deposited film of Fe, Ni about 2000Å thick is formed within a vacuum apparatus. As a consequence, many magnetic thin film memory elements MF are manufactured in matrix at one time. A driving line to drive the magnetic thin film memory elements is obtained by photoetching copper strips on both surfaces of a thin epoxy resin plate or a thin polyester sheet in a manner that the strips on the one surface are orthogonal to those on the other surface. The lines on the both surfaces are rendered word lines and digit lines, respectively, and the memory device is assembled in a manner that each crossing point of the lines is arranged to overlap onto each memory element.

The principle of operation of the memory element will be depicted. The lines parallel to the easy magnetization axis in the drawing are word lines, while those orthogonal to the easy magnetization axis are digit lines. The digit line serves also as a sense line to read the storing state of information in the memory element.

In the figure, arrows A and B show the magnetization direction in the film in accordance with the storing state. Specifically, the upward arrow A in the drawing shows that information "0" is stored and the downward arrow shows that information "1" is stored in the memory element. Supposing that magnetic fields acting on the magnetic thin film by a digit current Id and a word current Iw are respectively Hd and Hw, when the current Iw of a unipolar pulse is allowed to run by selecting the word line W1, the magnetic field Hw acts to the whole of the memory elements MF below the word line W1, and the magnetization is directed on the axis of hard magnetization. At this time, pulse voltages of the opposite polarities are induced to each digit line which become reading voltages depending on whether magnetization is turned from the "1" state or "0" state. In recording, the digit current Id is fed so as to overlap the trailing edge of the Iw pulse, and in the condition of the magnetization being directed in the axis of hard magnetization, the magnetic field Hd of the polarity corresponding to an information signal is superimposed, thereby determining the magnetization direction in order to record information in the "1" state or "0" state. The value of Iw is set to generate the magnetic field Hw sufficient to turn the magnetization of the magnetic thin film from the easy magnetization axis to the axis of hard magnetization. The value of Id is set to generate the magnetic field Hd having about half the coercive force Hc of the magnetic thin film.

In conventional reading method, a minute electromagnetic induced voltage resulting from the rotation of the magnetization was used. Therefore, the S/N ratio at reading is so small that read-out was difficult. Moreover, since the electromagnetic induced voltage is proportional to the size of the magnetic moment, it is required to make the magnet thin film larger. In consequence, the magnetic field necessary for recording/reproducing is undesirably enlarged, thereby causing a hindrance to saving power. The amount of information stored per unit area is impossible to be increased.

SUMMARY OF THE INVENTION

This invention has been devised to solve the aforementioned disadvantages, and has for its essential object to provide a magnetic thin film memory of good S/N ratio thereby to record/reproduce information stably even from a small size memory element, and with of the low power consumption, an enhanced the information transfer rate, and high recording density.

The above and further objects and features of the invention will more fully be apparent from the following detailed description with accompanying drawings.

BRIEF DESCRIPTION OF THE DRAWINGS

FIGS. 3(a) and 3(b) are views showing the state of the flowing currents in the recording lines immediately above or below the magnetic thin film memory element 1ac;

FIGS. 6(a) and 6(b) are views showing the state of the flowing currents in the record lines immediately above or below the magnetic thin film memory element 41ac;

FIGS. 10(a) and 10(b) are graphs showing the hysteresis loop of the magnetic thin film used in embodiment 1;

Figure 15:
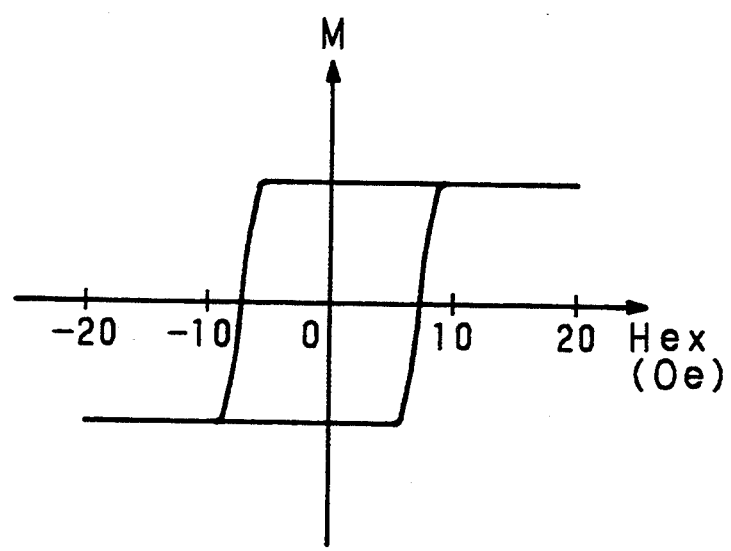
FIG. 15 is a graph showing the hysteresis loop of the magnetic thin film used in Embodiment 1 when an external magnetic field of ±20 Oe being applied thereto.
Figure 17:
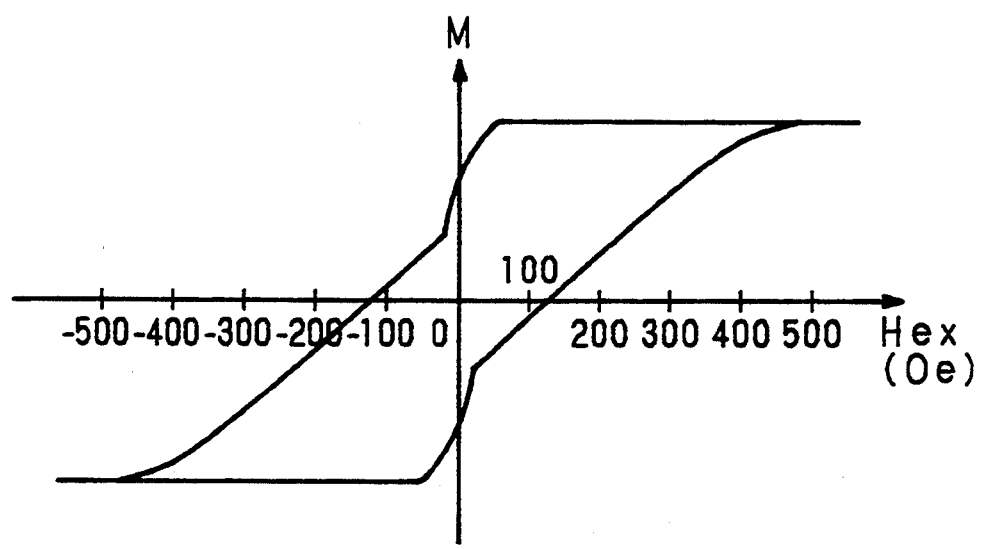
Figure 18:
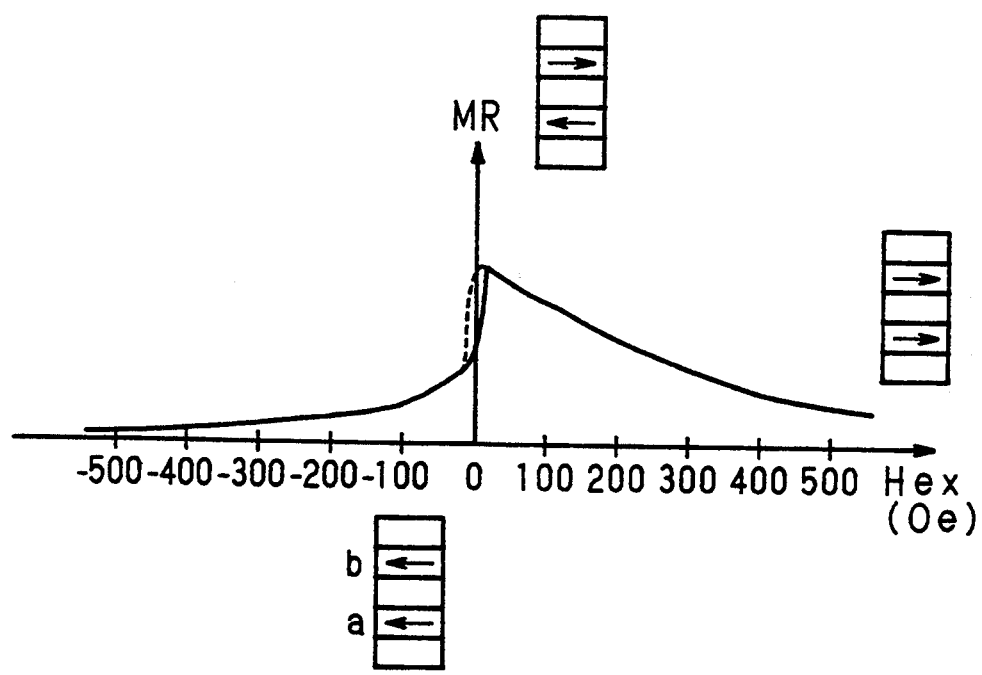
Figure 19:
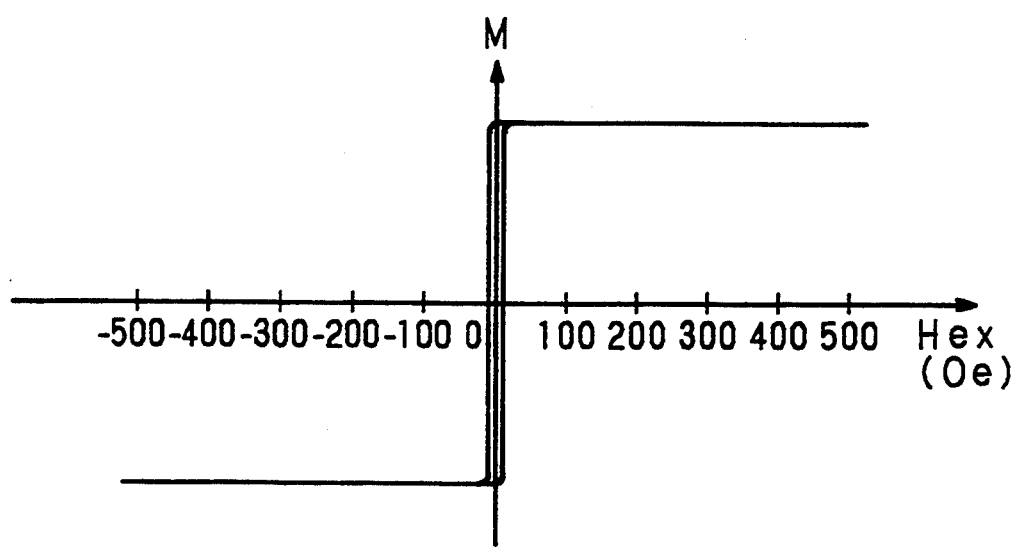
Figure 20:
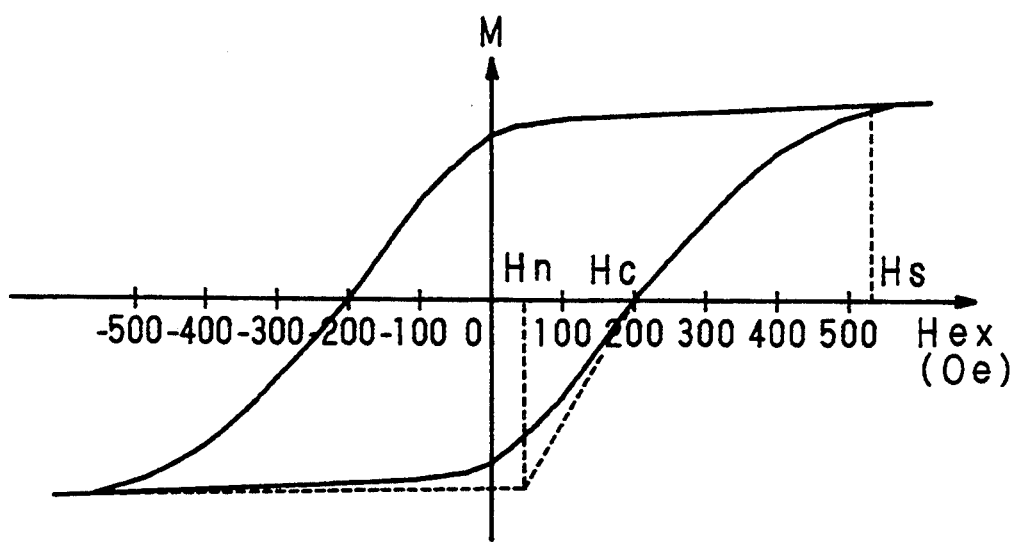
Figure 21:
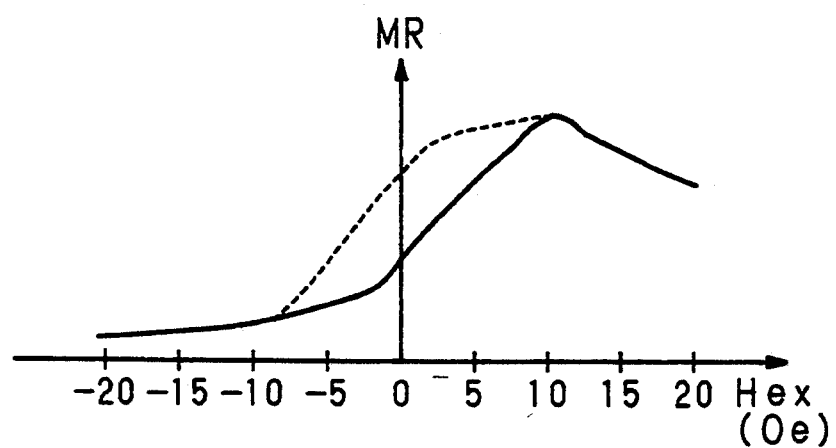
Figure 22:
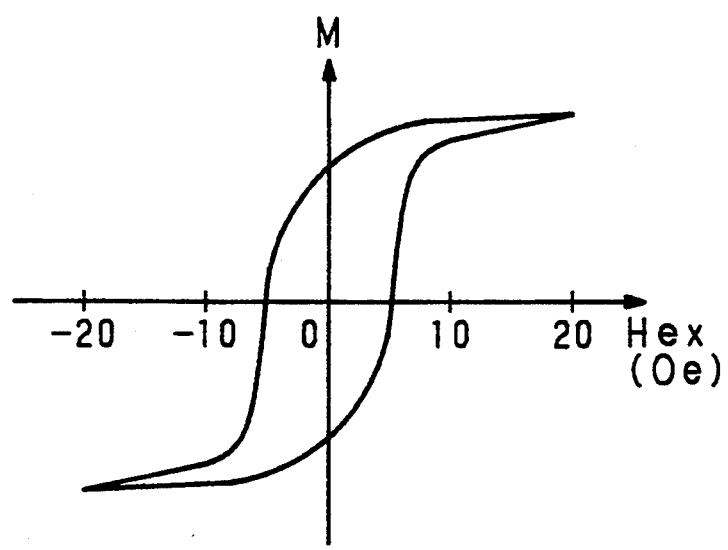
Figure 23:
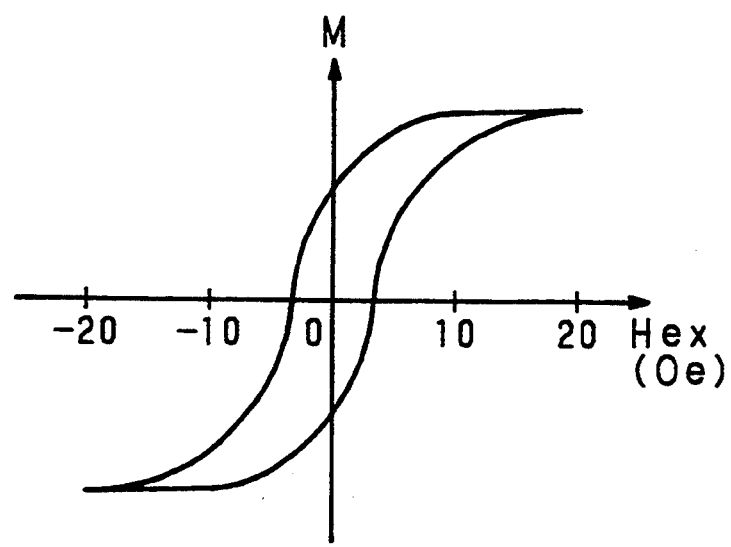
Figure 26:
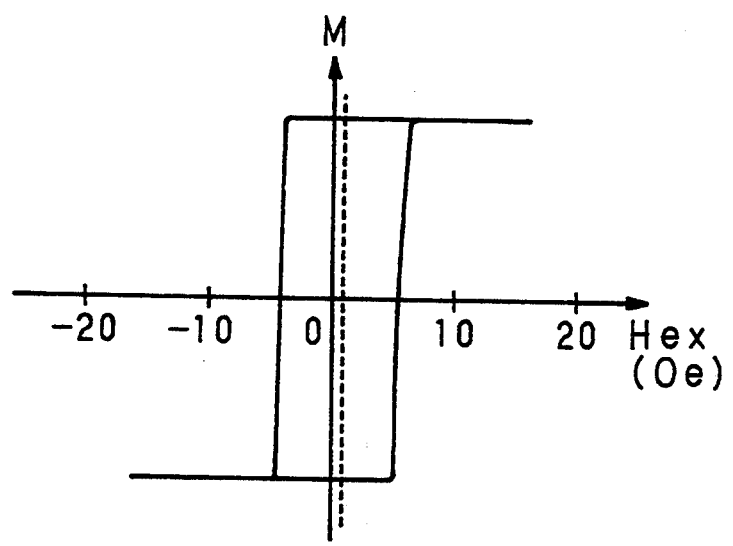
Figure 27:
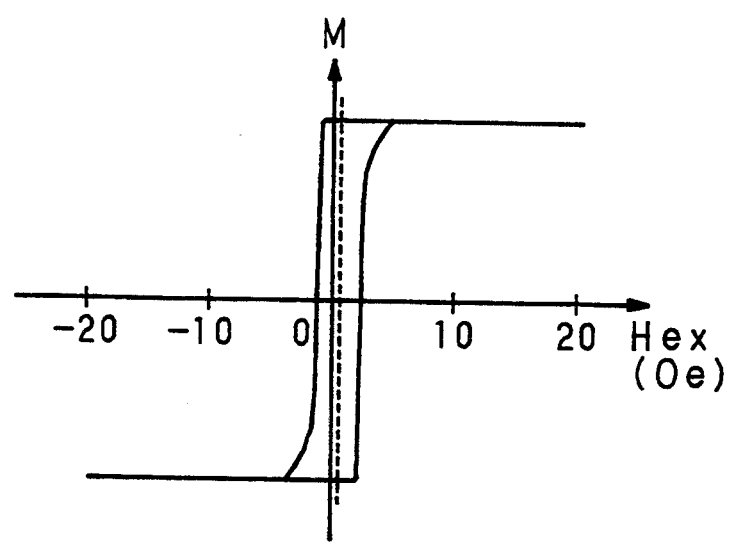
Figure 28:
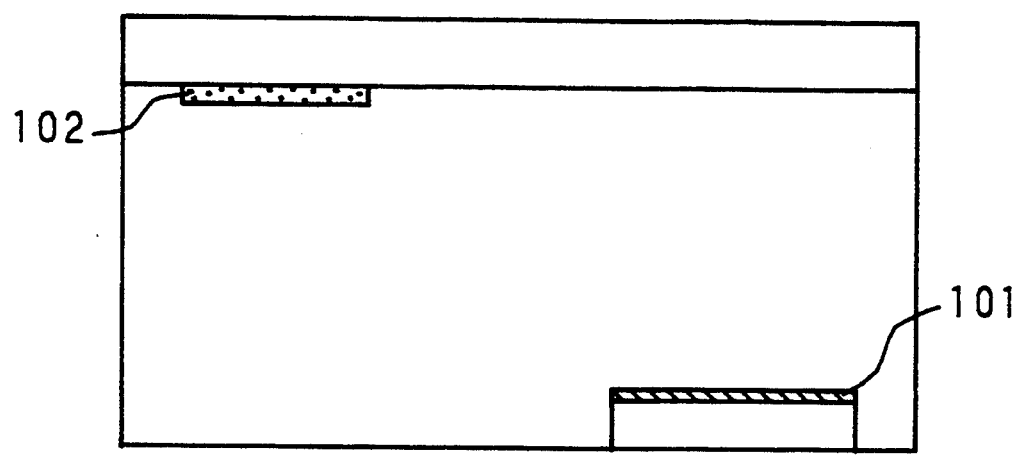
Figure 29:
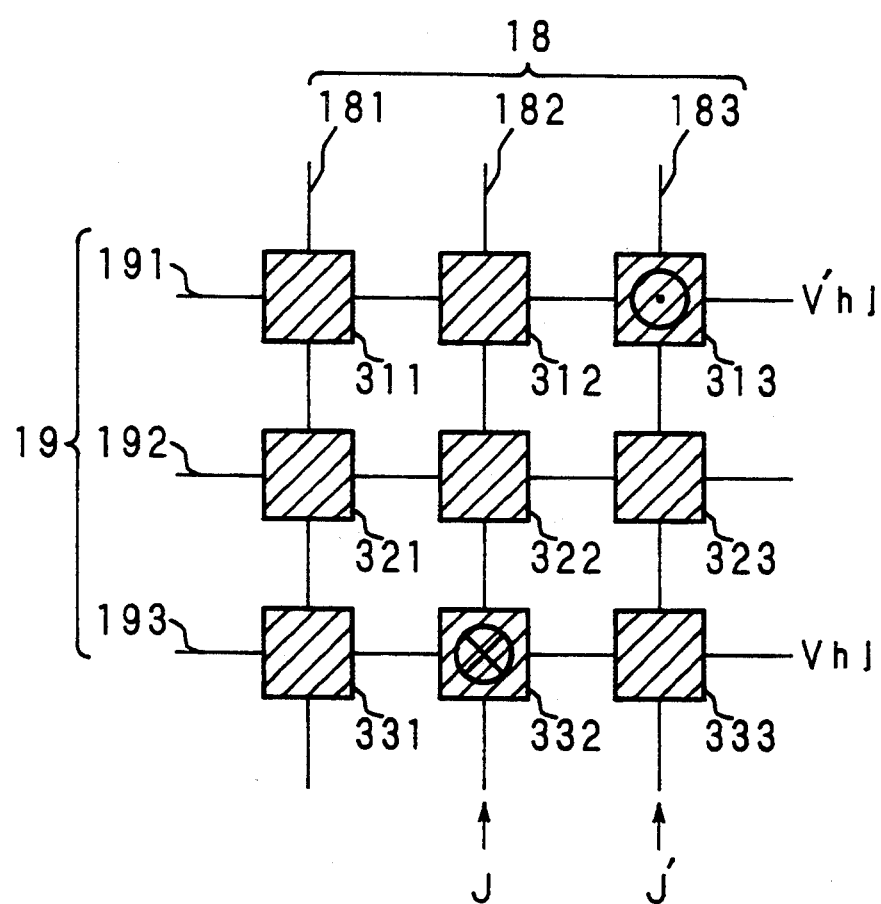
Figure 30:
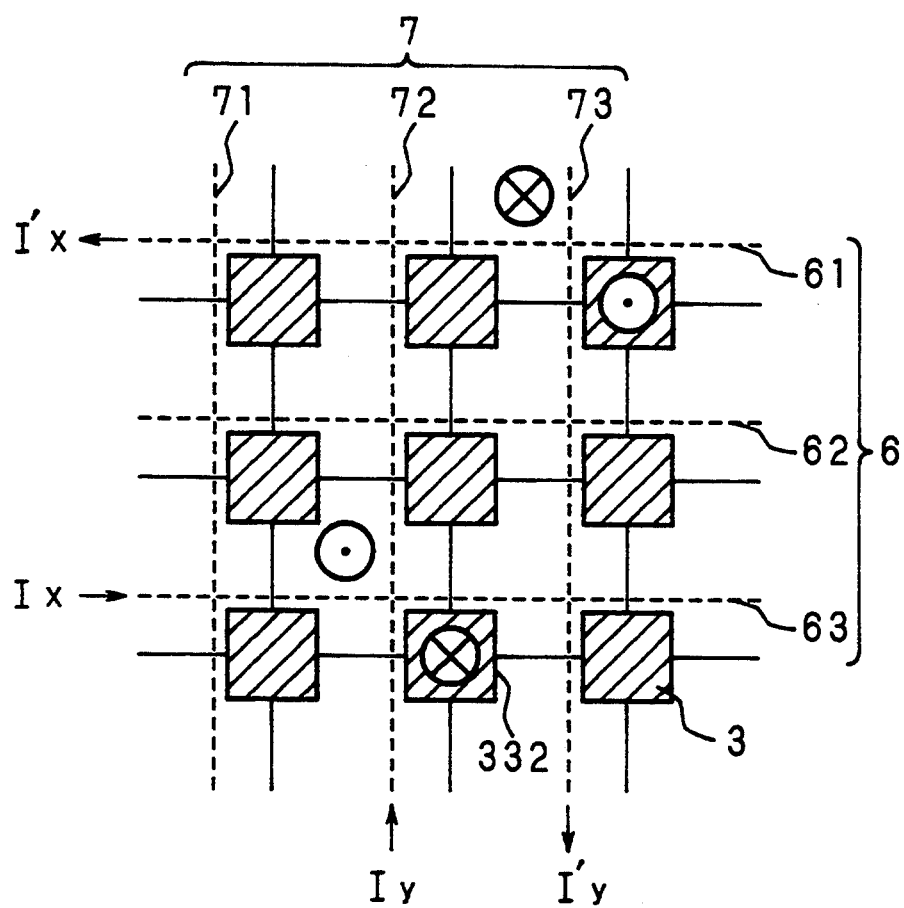
Figure 31:
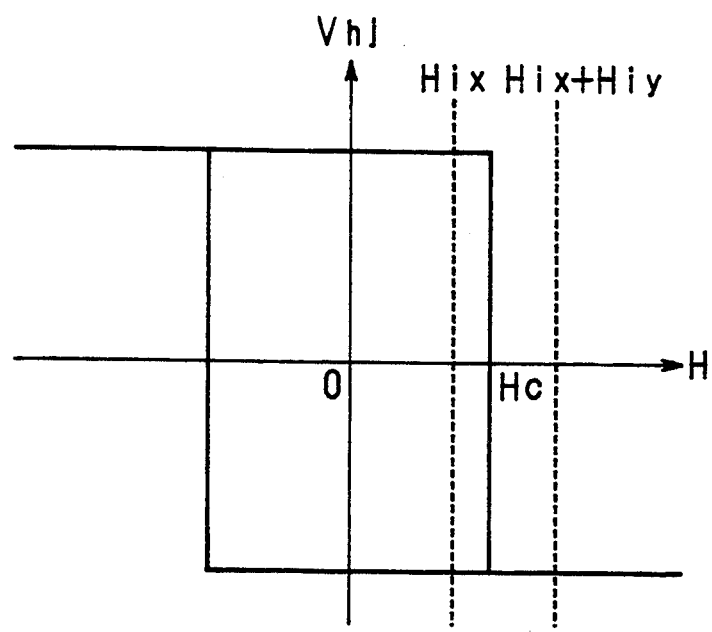
Figure 32:
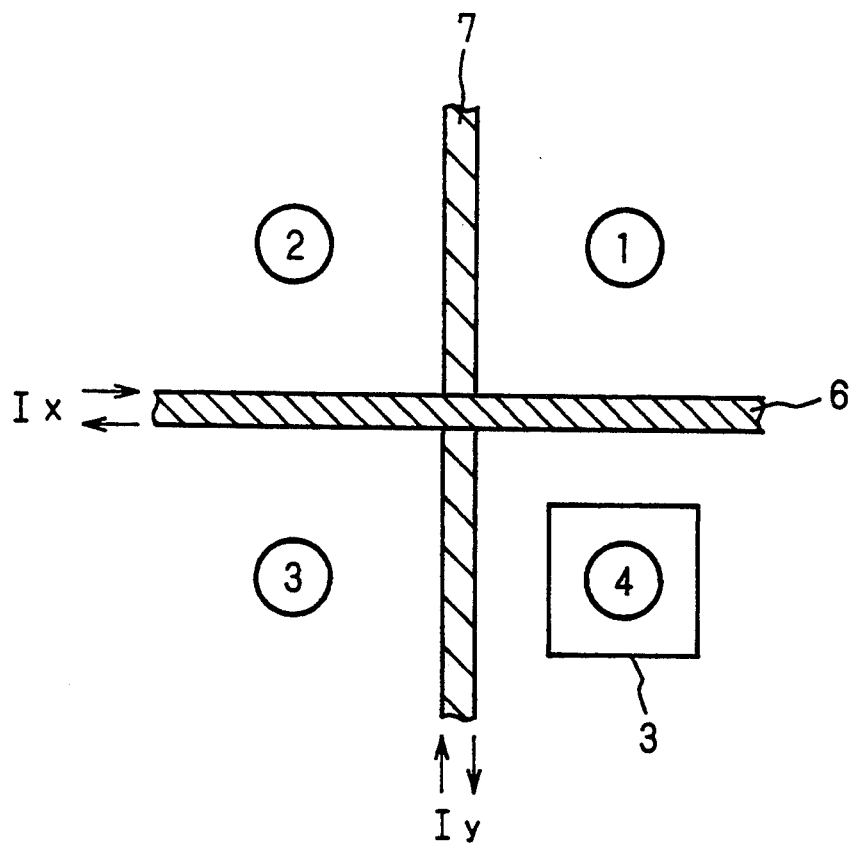
Figure 33:
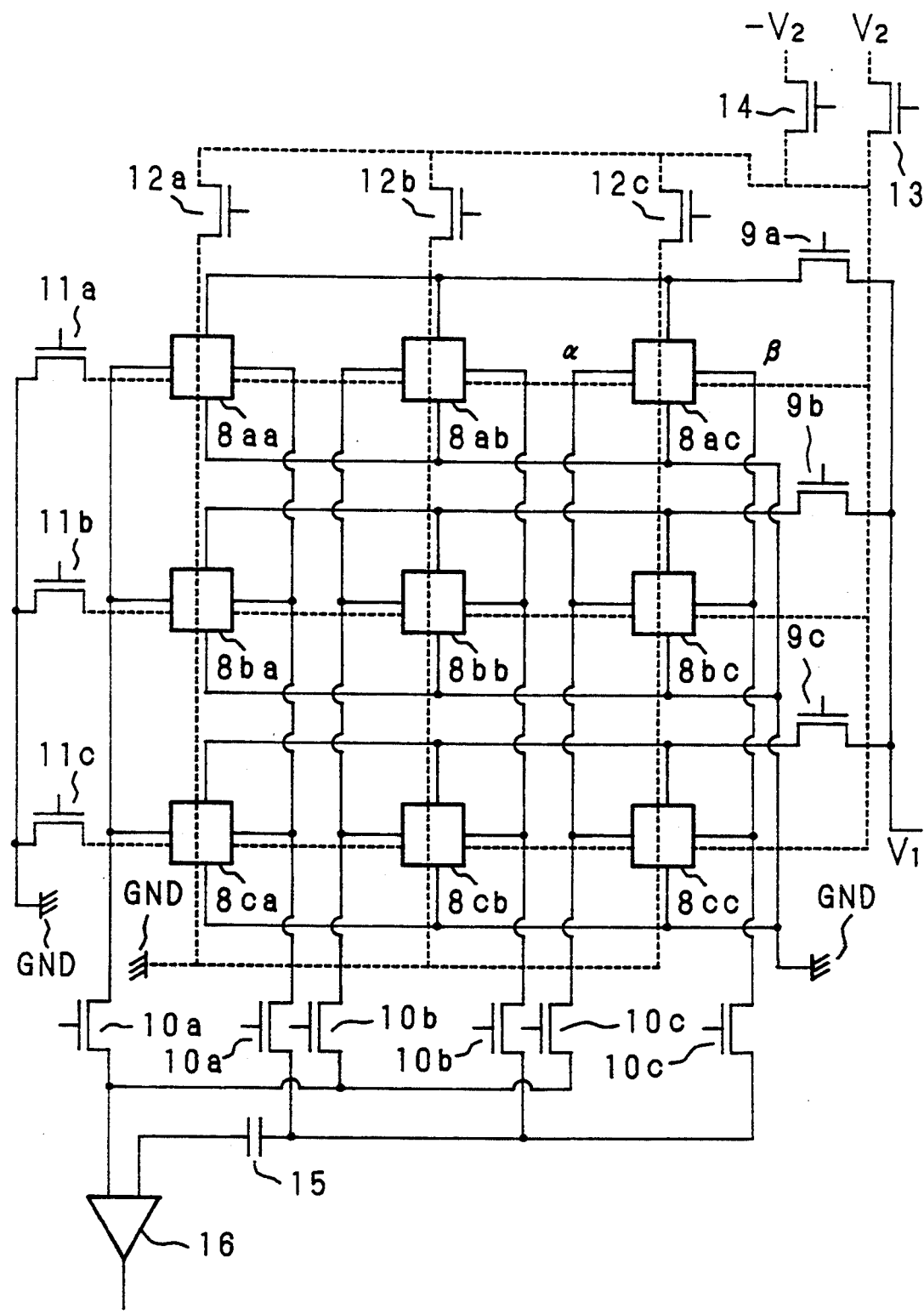
Figure 34:
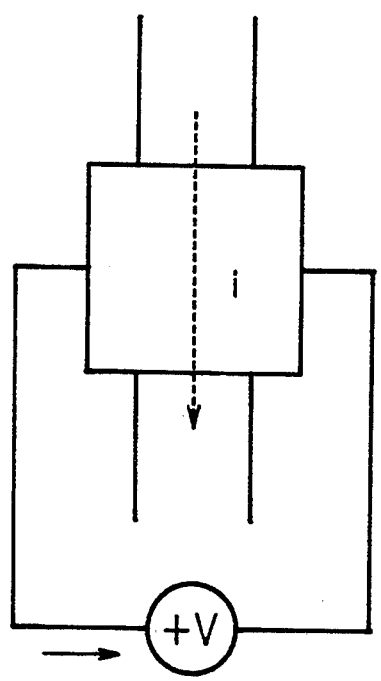
Figure 35:
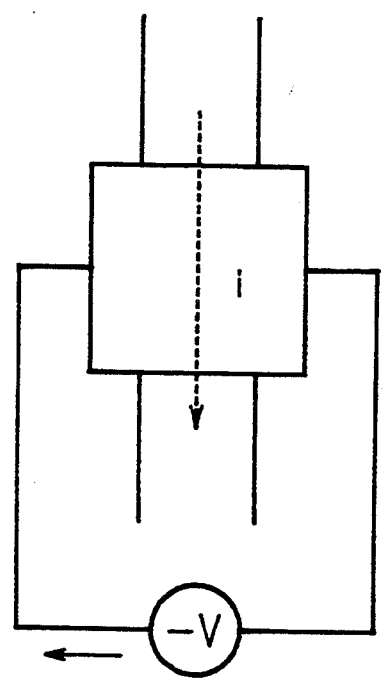
Figure 36:
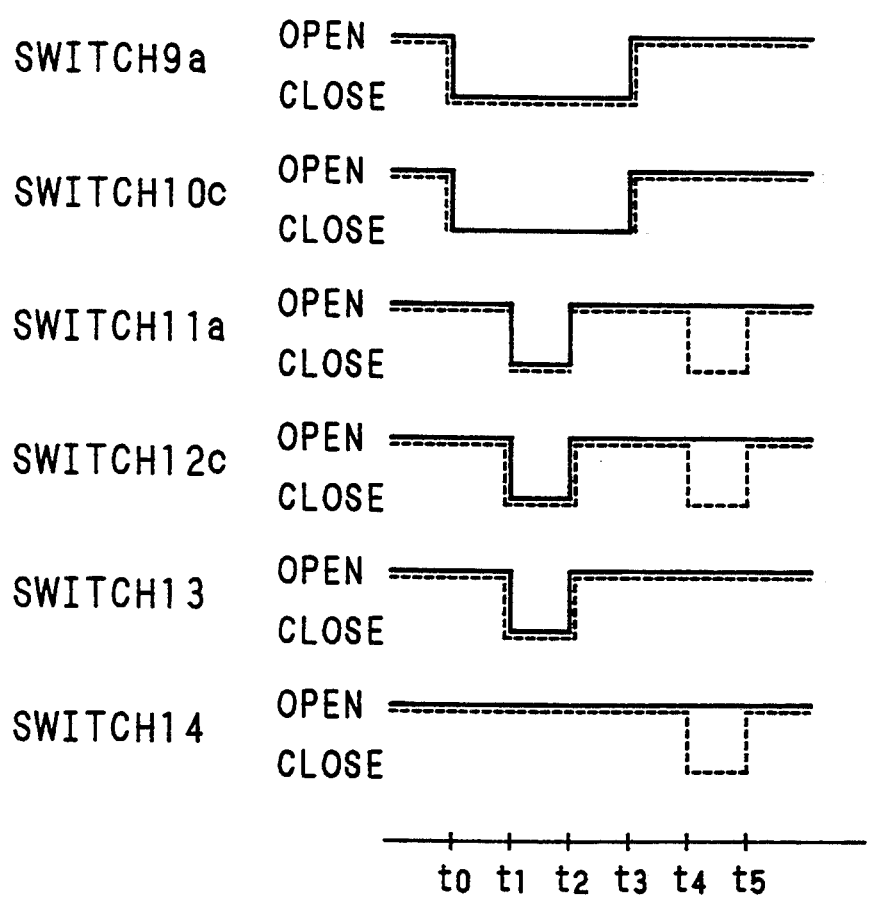
Figure 37:
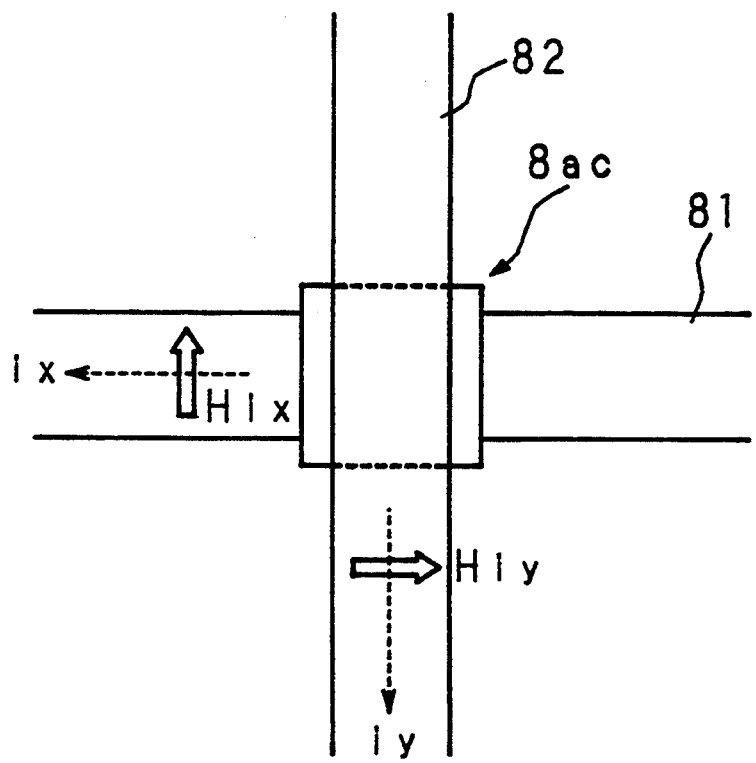
Figure 38:
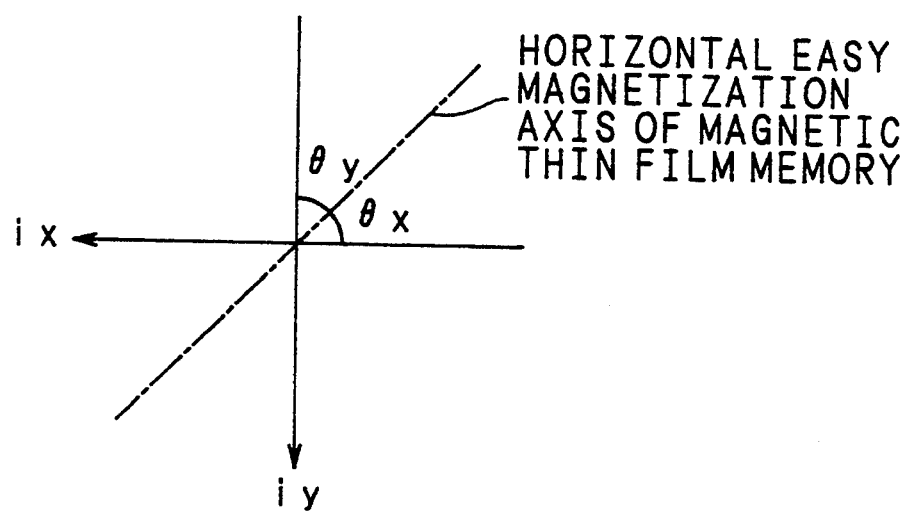
Figure 39:
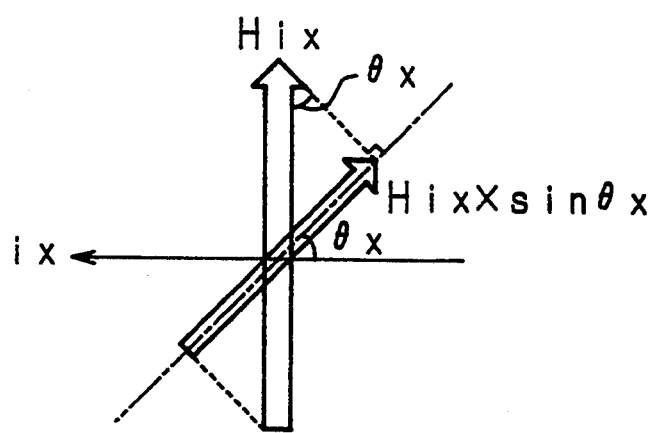
Figure 40:
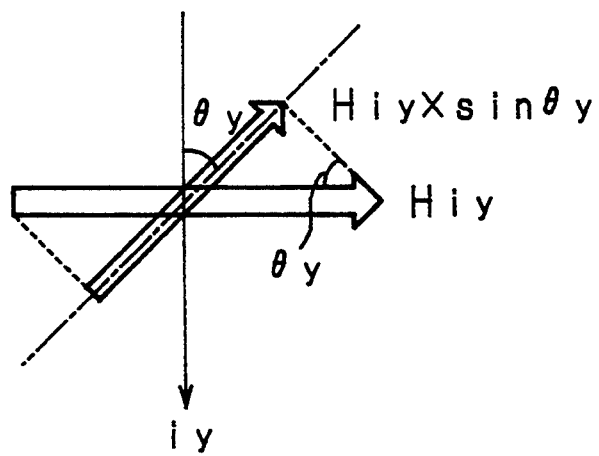
Figure 41:
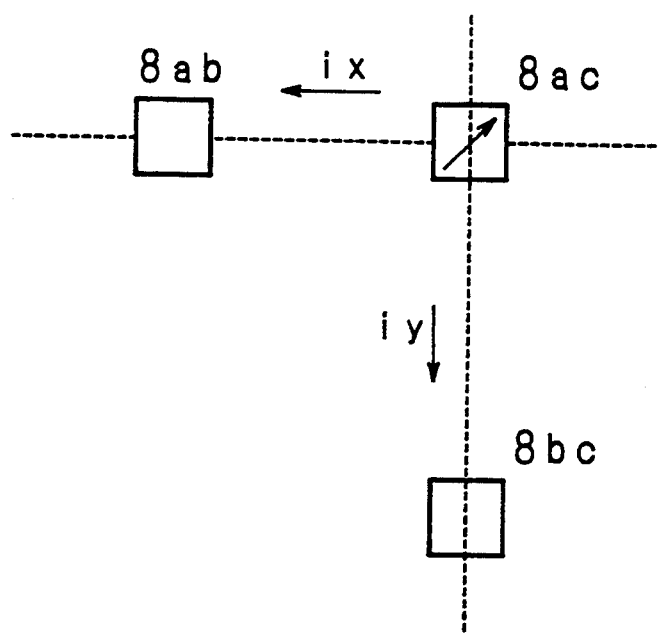
Figure 42:
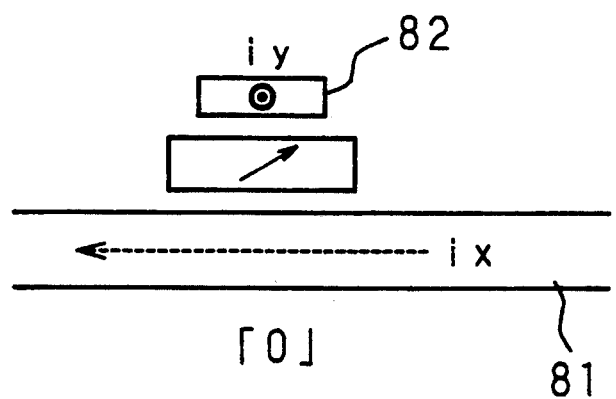
Figure 43:
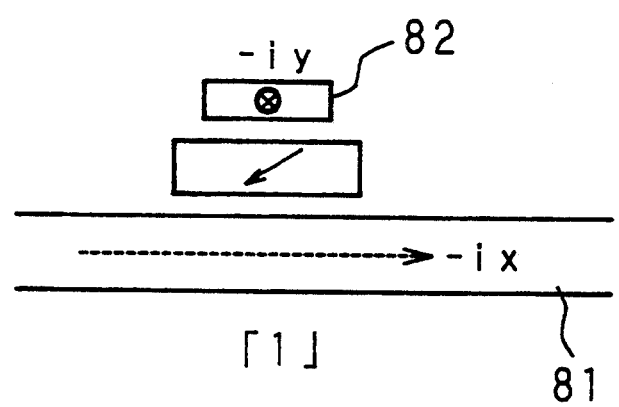
Figure 44:
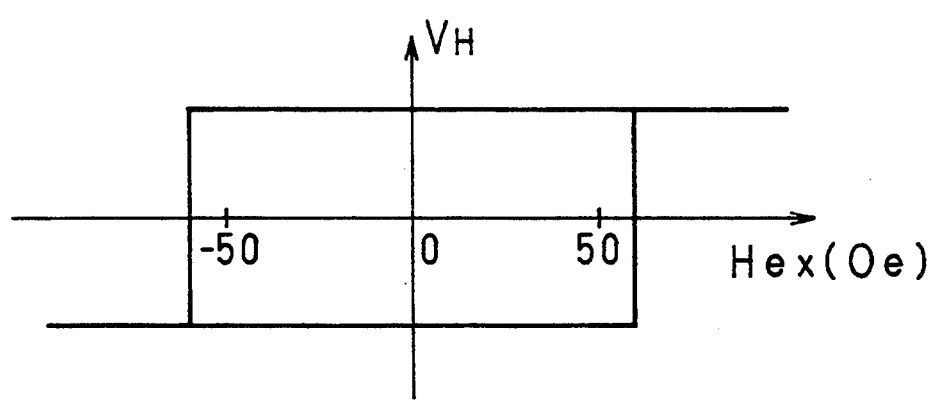
Figure 45:
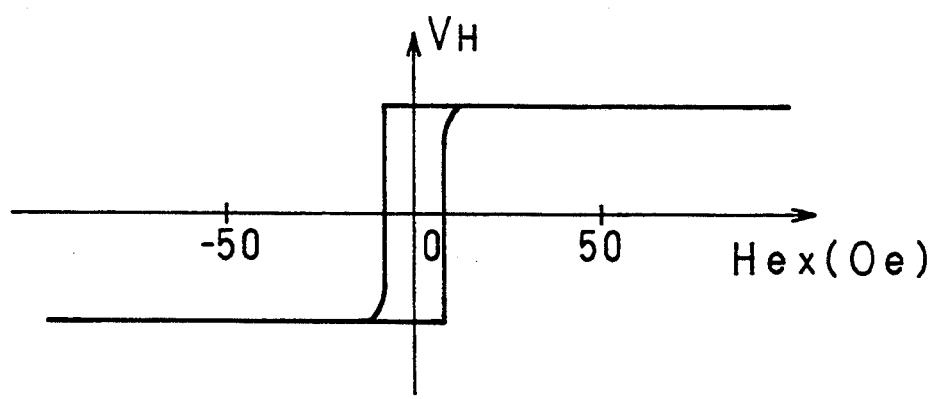
Figure 46:
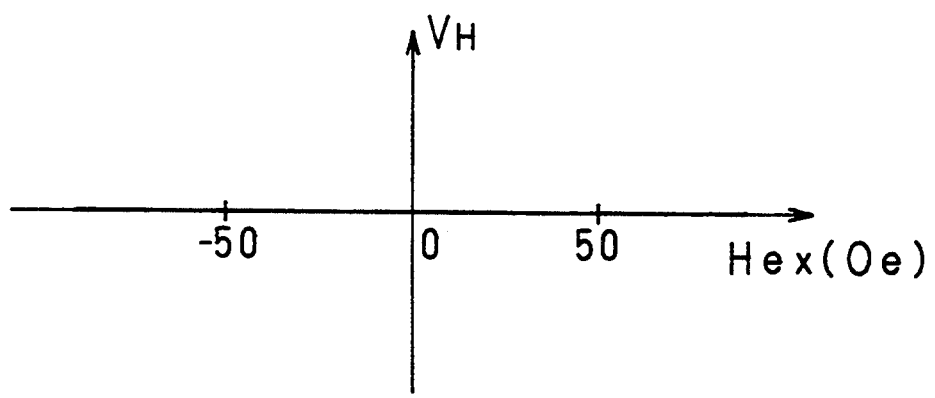
Figure 47:
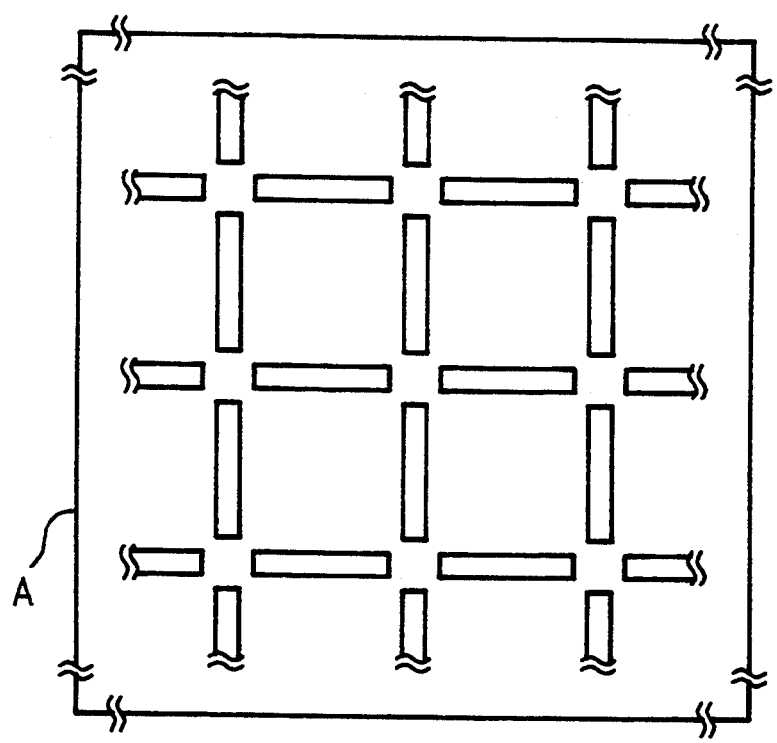
Figure 48:
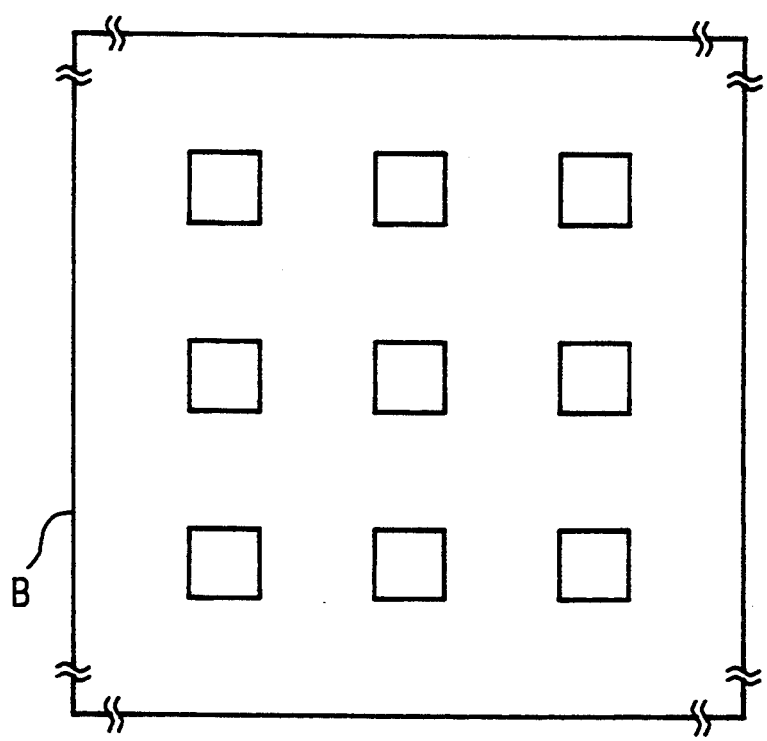
Figure 49:
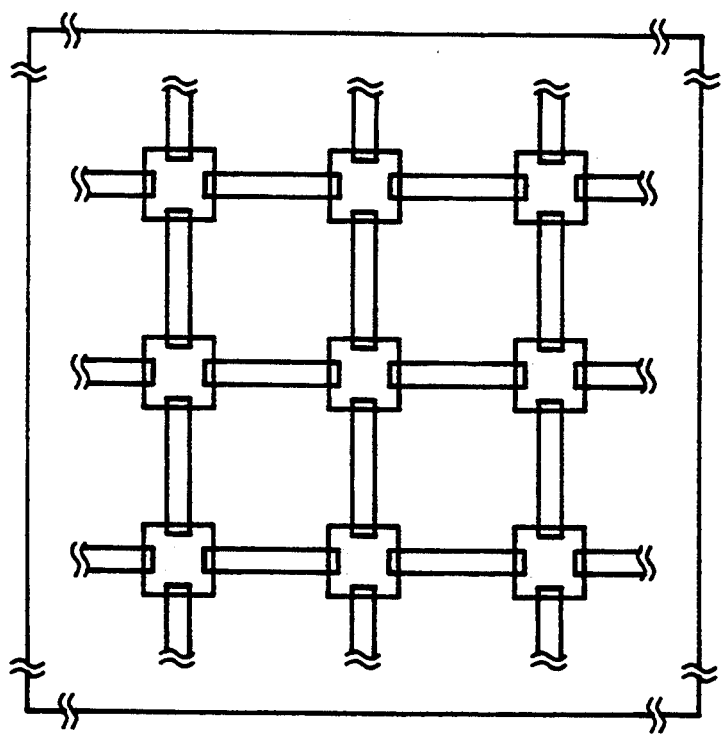
Figure 50:
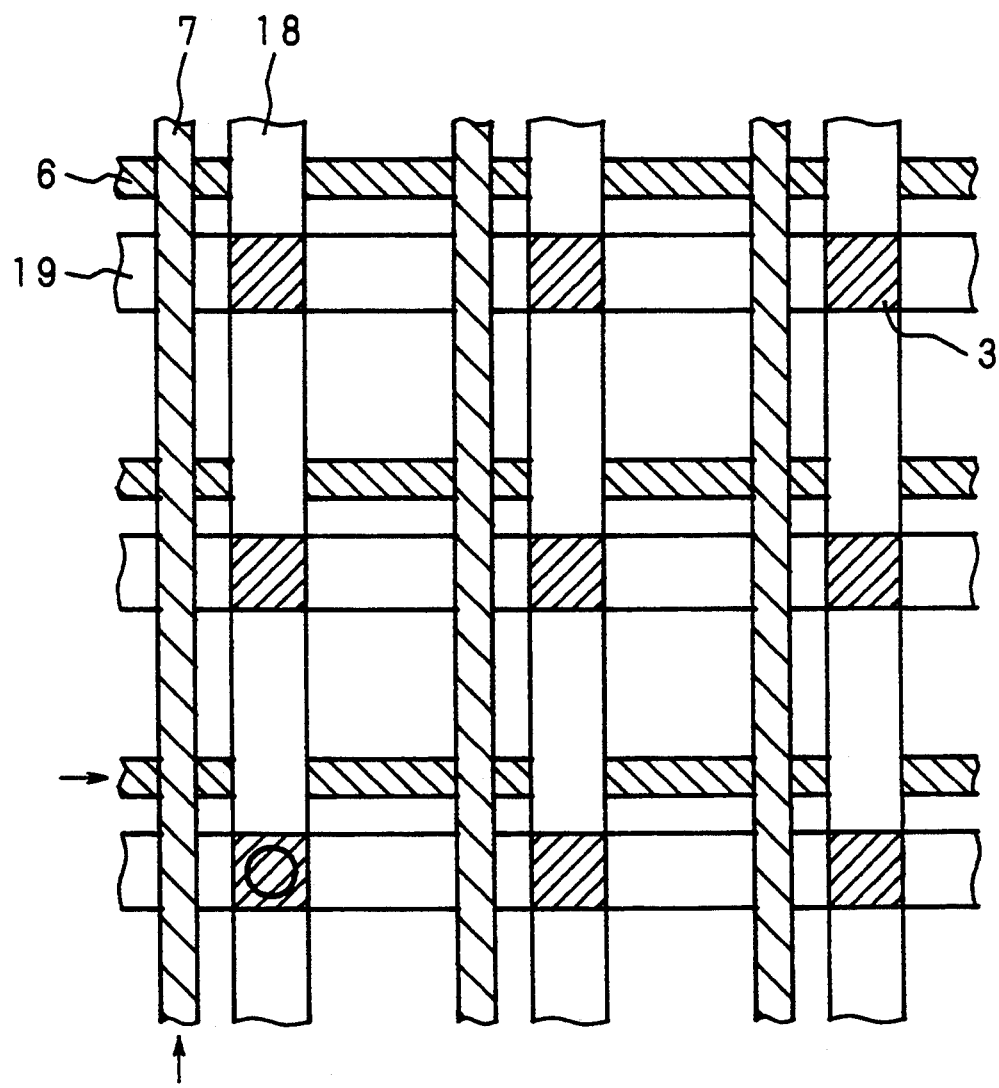
Figure 51:
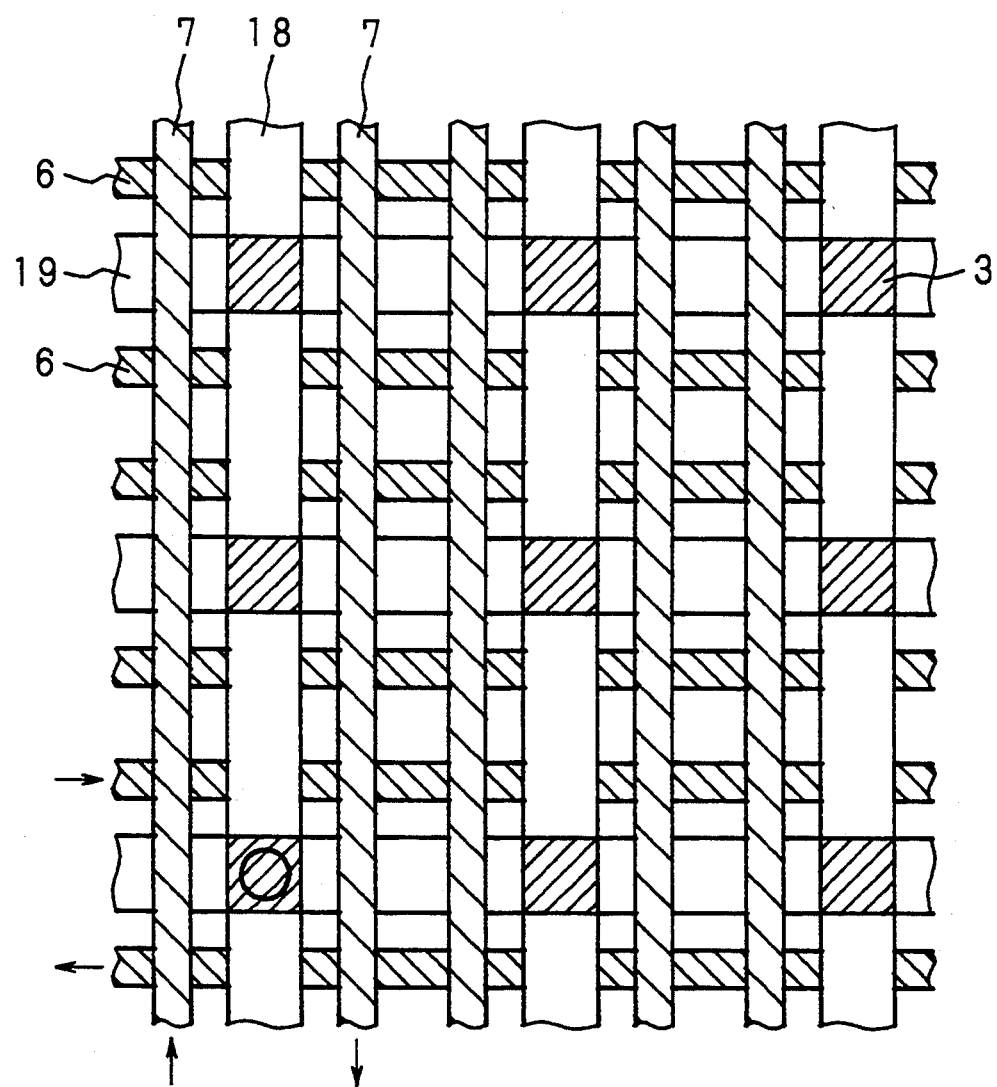

Oe perpendicular to that in FIG. 15 is being applied thereto;

FIG. 17 is a graph showing the hysteresis loop of the magnetic thin film used in Comparative Example 1;

FIG. 18 is a view showing changes in resistance of the magnetic thin film used in Comparative Example 1;

FIG. 19 is a graph showing the hysteresis loop of a NiFe/Cu laminated film;

FIG. 20 is a graph showing the hysteresis loop of a Co/Cu laminated film;

FIG. 21 is a view of the central portion of FIG. 18 enlarged in the direction of abscissa;

FIG. 22 is a graph showing the hysteresis loop of the magnetic thin film used in Comparative Example 1 when an external magnetic field of ±20 Oe being applied thereto;

FIG. 23 is a graph showing the hysteresis loop of the magnetic thin film used in Comparative Example 1 when an external magnetic field of ±20 Oe is applied thereto in the same direction as in FIG. 22 while a magnetic field of 6 Oe is being applied perpendicular to that in FIG. 22;

FIGS. 24(a) and 24(b) are graphs showing the hysteresis loop of the magnetic thin film used in Embodiment 2;

FIGS. 25(a) and 25(b) are graphs showing changes in resistance of the magnetic thin film used in Embodiment 2;

FIG. 26 is a graph showing the hysteresis loop of the magnetic thin film used in Embodiment 2 when an external magnetic field of ±20 Oe is being applied thereto;

FIG. 27 is a hysteresis loop of the magnetic thin film used in Embodiment 2 when an external magnetic field of ±20 Oe is applied thereto in the same direction as in FIG. 24 while a magnetic field of 4 Oe perpendicular to that in FIG. 24 is being applied thereto;

FIG. 28 is a schematic sectional view of a sputtering apparatus;

FIG. 29 is a view explanatory of the principle of the reading information from the magnetic thin film memory in an embodiment of the invention;

FIG. 30 is a view explanatory of the magnetic thin film memory in an embodiment of the invention;

FIG. 31 is a graph showing the Hall hysteresis loop of the magnetic thin film memory element in an embodiment of the invention;

FIG. 32 is a view explanatory of a specific positional relationship between recording lines and magnetic thin film elements in an embodiment of the invention;

FIG. 33 is a circuit diagram of an embodiment of the invention;

FIG. 34 is views explanatory of the principle of reading information from the magnetic thin film memory of the invention;

FIG. 35 is views explanatory of the principle of reading information from the magnetic thin film memory of the invention;

FIG. 36 is a timing chart in reading information from the magnetic thin film memory of the invention;

FIG. 37 is a view explanatory of the recording operation of the magnetic thin film memory of the invention;

FIG. 38 is a view explanatory of the recording operation of the magnetic thin film memory of the invention;

FIG. 39 is a view explanatory of the recording operation of the magnetic thin film memory of the invention;

FIG. 40 is a view explanatory of the recording operation of the magnetic thin film memory of the invention;

FIG. 41 is a view explanatory of the recording operation of the magnetic thin film memory of the invention;

FIG. 42 is a view explanatory of the recording operation of the magnetic thin film memory of the invention;

FIG. 43 is a view explanatory of the recording operation of the magnetic thin film memory of the invention;

FIG. 44 is a graph showing the Hall hysteresis loop when an external magnetic field is being applied perpendicular to the surface of the magnetic thin film used in the invention;

FIG. 45 is a graph showing the Hall hysteresis loop when a magnetic field is being applied in the horizontal and the easy magnetization axis direction of the magnetic thin film surface used in the invention;

FIG. 46 is a graph showing the Hall hysteresis loop when a magnetic field is being applied in the horizontal and the hard magnetization axis direction of the magnetic thin film used in the invention;

FIG. 47 is a plan view of a mask for forming reading lines of a magnetic thin film memory of Embodiment 5 of the invention;

FIG. 48 is a plan view of a mask for forming magnetic thin film memory in Embodiment 5 of the invention;

FIG. 49 is a schematic diagram of the pattern of a magnetic thin film memory obtained in Embodiment 5 of the invention;

FIG. 50 is a layout pattern of a magnetic thin film memory in Embodiment 6 of the invention; and FIG. 51 is a layout pattern of a magnetic thin film memory in Embodiment 7 of the invention.

DESCRIPTION OF THE PREFERRED EMBODIMENTS

Preferred embodiments of the present invention will now be described below with reference to the attached drawings.

Figure 1:
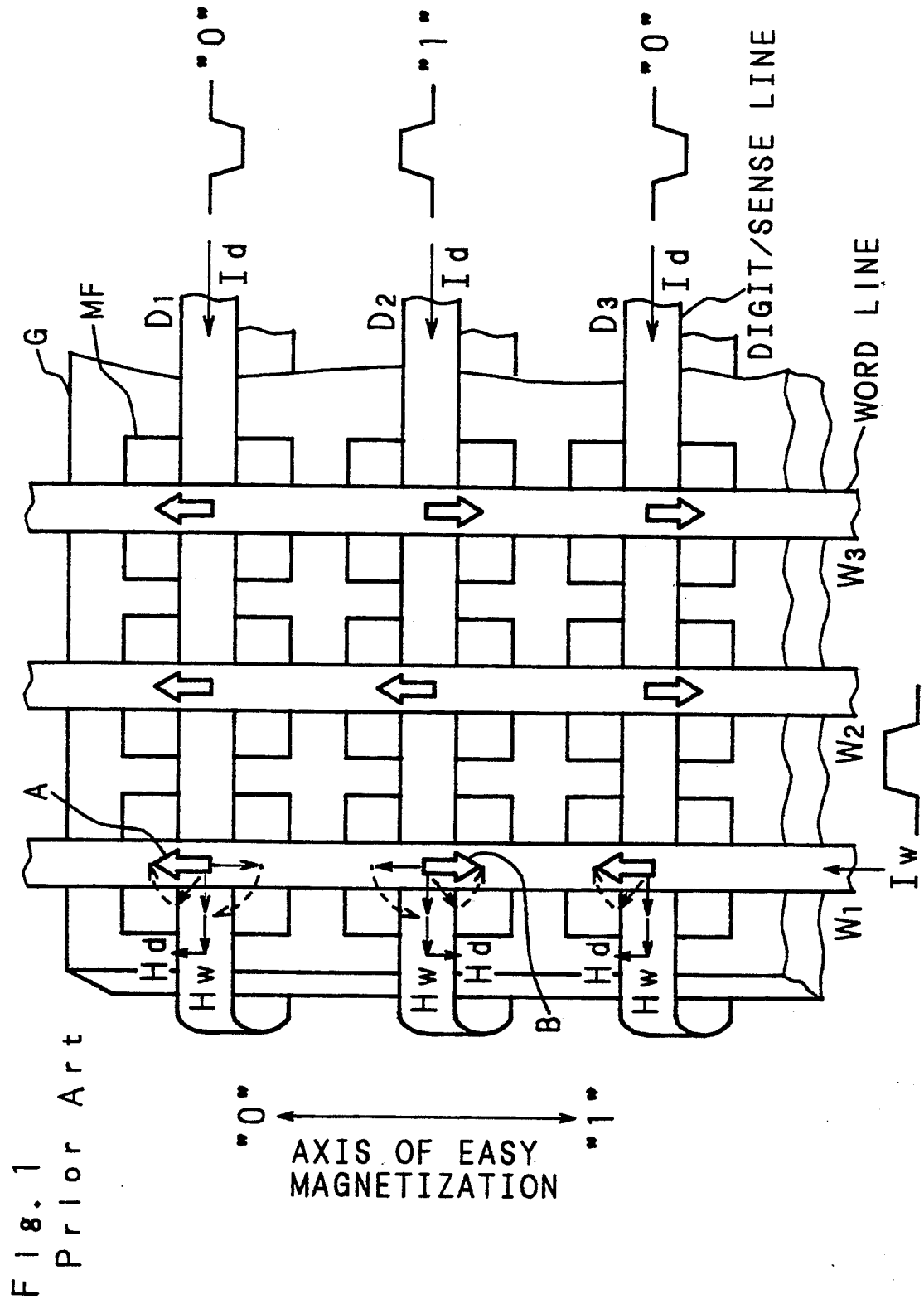
FIG. 1 is a schematic view showing the construction of a conventional magnetic thin film memory.
Figure 2:
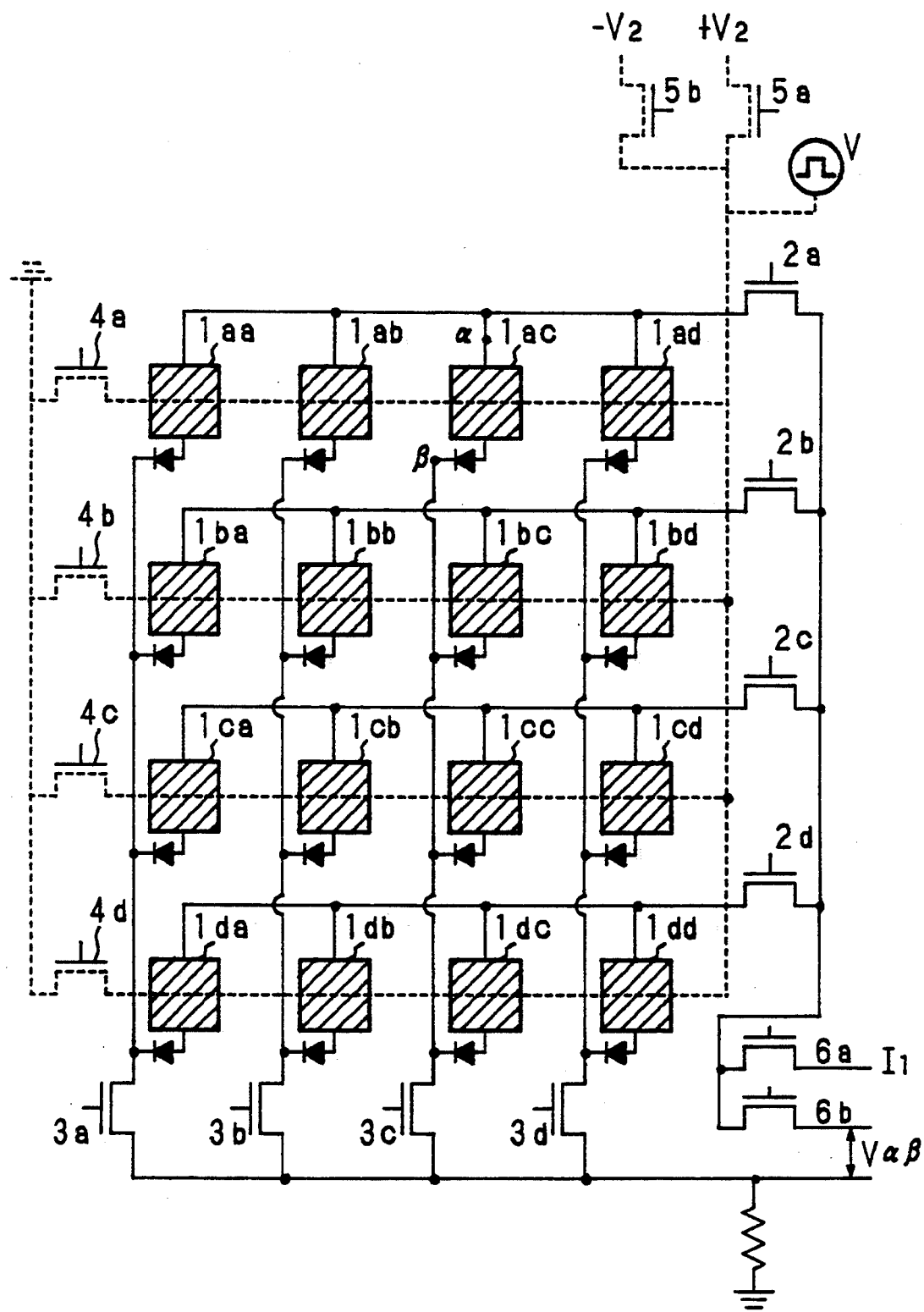
FIG. 2 is a circuit diagram of a magnetic thin film memory in an embodiment of the invention.

FIG. 2 is a conceptual drawing illustrative of the construction of a magnetic thin film memory in an embodiment of the invention. In FIG. 2, a numeral 1 denotes a magnetic thin film memory element (referring to memory element, hereinafter) with suffix added thereto as 1aa, 1ab, . . . , 1cc to show addresses, which may be omitted if unnecessary to be referred to and simply denoted as 1. This applies to other numerals as well. Numerals 2 through 6 are switching transistors. A symbol $I_1$ denotes a current source, $V_2$ denotes a positive voltage source and $V\alpha\beta$ denotes the voltage between both sides of the memory element 1ac. In the drawing, solid lines denote reproduction lines and dotted lines denote the recording lines.

The memory element 1ac is made of an multi-layer film alternately laminating a magnetic layer a of a higher coercive force and a magnetic layer b of a lower coercive force via a nonmagnetic layer c in a repetitive manner as a/c/b/c/a/c/b/c . . . . The magnetic layer a of a higher coercive force is made of an alloy such as NiCoPt, NiCoTa, NiCoCr, NiCoZr, NiCo or the like, the magnetic layer b of a lower coercive force is made of an alloy such as NiFe, NiFeCo or the like, and the nonmagnetic layer c is made of a nonmagnetic material such as Cu, Cr, V, W, Al, Al-Ta or the like. In manufacturing the above mentioned magnetic thin film, the combination of a magnetic layer a, a nonmagnetic layer c and a magnetic layer b 5Å to 70Å thick each, preferably 10Å to 60Å are laminated repetitively in 1 to 20 cycles, to the total thickness 50Å to 5000Å, on an insulated substrate of Si or a glass, for example, coated with an insulator film such as $SiO_2$, $Al_2O_3$ or $SiN_x$. These layers may be formed through sputtering, MBE, ultra high vacuum evaporation, electron beam evaporation, vacuum evaporation or the like. As for the sputtering, DC magnetron sputtering which allows relatively easy power control is convenient, but RF sputtering or other sputtering is also applicable to form the layers.

Magnetization directions of the magnetic layers a and b are arranged to be the same direction, for example, upward of the drawing, by applying to the entire memory elements a magnetic field of a sufficient intensity in the horizontal direction perpendicular to the recording lines, before magnetically shielding the memory element 1ac.

The method of data recording will be described below. Data recording is carried out by means of the magnetization direction of the memory element. Since the magnetization direction of the magnetic layer b which is applied for the information recording is horizontal, the magnetization direction of the same direction as the flowing current in the reproduction lines (downward of the drawing) is taken as "1" and the opposite magnetization direction (upward of the drawing) to "0" in order to correspond to the respective binary digital information. Operation in a case of recording data "1" in the memory element 1ac, for example, namely writing data of the downward magnetization in the drawing will be described below with reference to FIGS. 2 and 3.

In FIG. 2, switches 4a, 4b, 4c, 4d, 5a and 5b are all open, and no current flows in the recording lines indicated by the dotted lines, when recording is not done. In order to record data "1" on the memory element 1ac, switches 2a, 3c and 6a are closed. At this time, a relatively large current $I_1$ flows in the reproducing line indicated by the solid line and the memory element 1ac. The state of the flowing current is shown in FIG. 3. A numeral 21 in FIG. 3 denotes the reproduction line indicated by the solid line in FIG. 2 and a numeral 22 denotes the recording line indicated by the dotted lines in FIG. 2. As shown in FIG. 3, according to the current $I_1$, a bias magnetic field $H_1$ is applied to the memory element 1ac which slightly inclines the magnetization direction toward the direction of the bias magnetic field. Afterward, by closing the switches 4a and 5a, a current $I_2$ flows in the recording line 22 provided immediately above the memory element 1ac from right toward left of the drawing, which causes a magnetic field $H_2$ being applied to the memory element 1ac from up to down of the drawing. If data "1" is previously recorded on the memory element 1ac, the magnetic field $H_2$ restores the magnetization direction to the previous direction, downward of the drawing, thereby to retain the data "1". If data "0" is previously recorded on the memory element 1ac, since the magnetization, upward of the drawing, in the magnetic layer b of the memory element 1ac has a coercive force Hcb which is too high to be reversed by the magnetic field $H_2$ only, the magnetization is reversed to downward of the drawing only when the bias magnetic field $H_1$ is applied, thereby to record "1" only on the memory element 1ac. An arrow shown in the drawing of the memory element 1ac indicates the horizontal magnetization direction. While recording data "0" on the memory element 1ac is carried out in exactly the same manner except for connecting the switch 5b instead of the switch 5a and flowing $I_2$ as shown on the right of FIG. 3.

Figure 4:
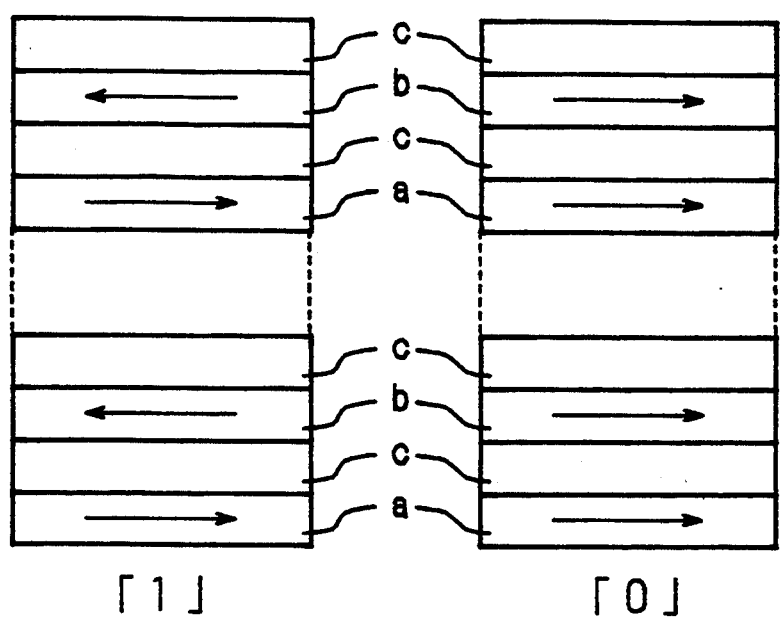
FIG. 4 is a sectional view showing the magnetized state of the magnetic thin film.

FIG. 4 is a sectional view of the memory element in the state of "0" and "1" recorded as described above.

Magnetization directions of the magnetic layer a and the magnetic layer b of the memory element 1ac are magnetized in the same direction (referring to parallel, hereinafter) for "0" and magnetized in the opposite directions (referring to antiparallel, hereinafter) for "1".

Recording on the memory elements other than the memory element 1ac can be done similarly.

Though, in the above-described embodiment, the directions of the magnetic layer a and the magnetic layer b of the memory element 1ac are the same as the direction of reproduction current, an embodiment where the directions of the magnetic layers a and b of the memory element 1ac are perpendicular to the direction of reproduction current will be described below with reference to FIG. 5.

Figure 5:
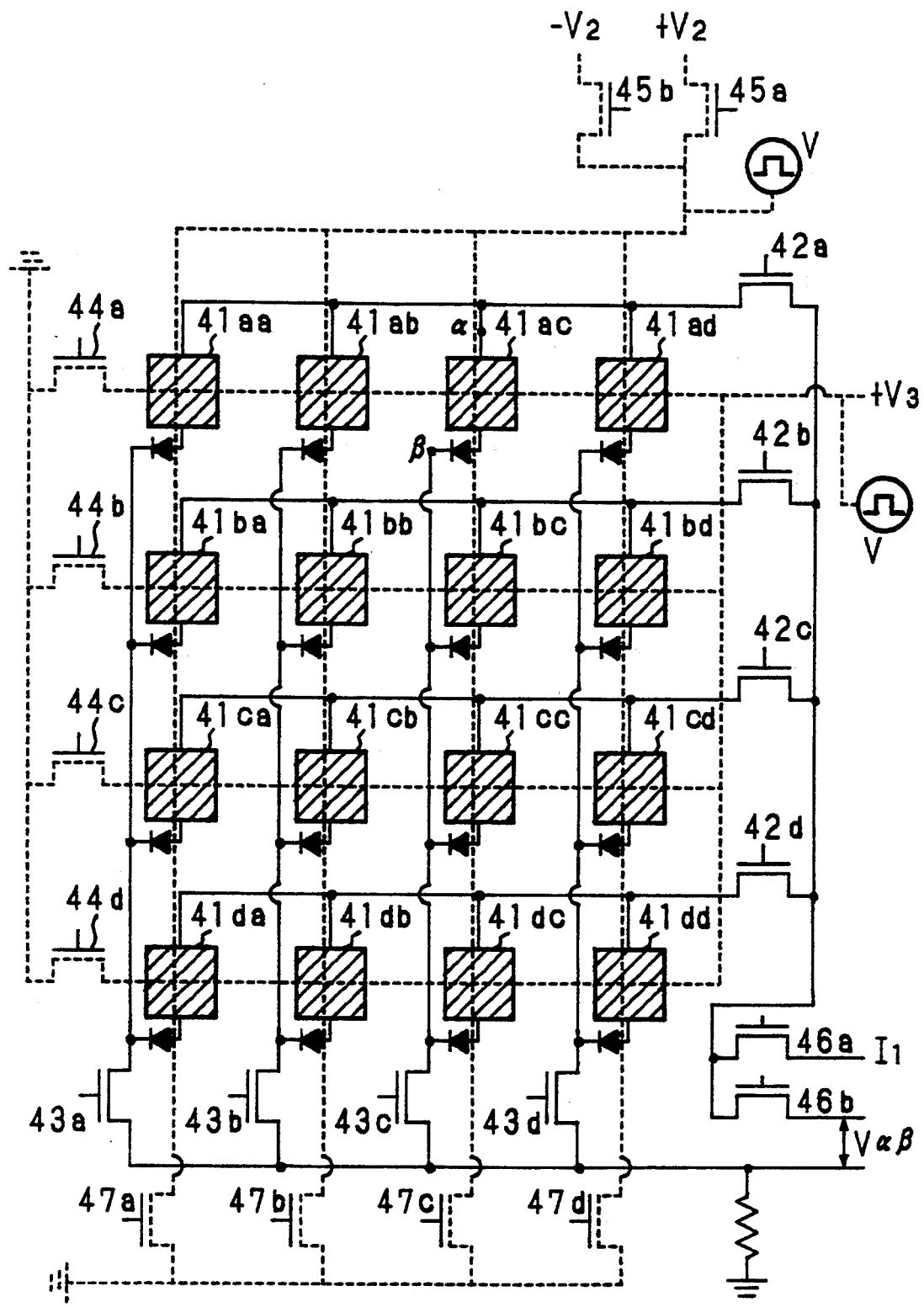
FIG. 5 is a circuit diagram of a magnetic thin film memory in another embodiment of the invention.

In FIG. 5, a numeral 41 denotes a memory element with suffix added thereto as 41aa, 41ab, . . . , 41cc to show addresses, which may be omitted if unnecessary to be referred to and simply denoted as 1. This applies to other numerals as well. Numerals 42 through 47 are switching transistors. A symbol $I_1$ denotes a current source, $V_2$ denotes a positive voltage source and $V\alpha\beta$ denotes the voltage between both sides of the memory element 41ac. In the drawing, solid lines denote reproduction lines and dotted lines denote the recording lines.

The memory element 1ac is made of an multi-layer film alternately laminating a magnetic layer a of a higher coercive force and a magnetic layer b of a lower coercive force via a nonmagnetic layer c in a repetitive manner as a/c/b/c/a/c/b/c . . . . Magnetization directions of the magnetic layers a and b are arranged to be the same direction, for example, upward of the drawing, by applying to the entire memory elements a magnetic field of a sufficient intensity in the horizontal direction perpendicular to the recording lines, before magnetically shielding the memory element 41ac.

Data recording is carried out by means of the magnetization direction of the memory element. Since the magnetization direction of the magnetic layer b which is applied for the information recording is horizontal, rightward magnetization in the drawing is taken as "1" and the leftward magnetization in the drawing to "0" in order to correspond to the respective binary digital information. Operation in a case of recording data "1" in the memory element 41ac, for example, namely writing data of the rightward magnetization in the drawing will be described below with reference to FIGS. 5 and 6.

In FIG. 5, switches 44a, 44b, 44c, 44d, 45a, 45b, 47a, 47b, 47c and 47d are all open, and no current flows in the recording lines indicated by the dotted lines, when recording is not done. In order to record data "1" on the memory element 41ac, a switch 44 is closed. At this time, a relatively large current $I_3$ flows in memory element 41ac from right to left of the drawing. State of the flowing current is shown in FIG. 6. Numerals 52 and 53 in FIG. 6 denote the recording lines indicated by the solid lines in FIG. 5. As shown in FIG. 6, according to the current $I_3$, a bias magnetic field $H_3$ is applied to the memory element 41ac which slightly inclines the magnetization direction toward the direction of the bias magnetic field. Afterward, by closing the switches 45a and 47c, a current $I_2$ flows in the recording line 52 provided immediately above the memory element 41ac from up to down of the drawing, which causes a magnetic field $H_2$ being applied to the memory element 1ac from left to right of the drawing. If data "1" is previously recorded on the memory element 41ac, the magnetic field $H_2$ restores the magnetization direction to the previous direction, rightward of the drawing, thereby to retain the data "1". If data "0" is previously recorded on the memory element 41ac, since the magnetization direction, leftward of the drawing, in the magnetic layer b of the memory element 41ac has a coercive force Hcb which is too high to be reversed by the magnetic field $H_2$ only, the magnetization is reversed to rightward of the drawing only when the bias magnetic field $H_3$ is applied, thereby to record "1" only on the memory element 41ac. An arrow shown in the drawing of the memory element 41ac indicates the horizontal magnetization direction. While recording data "0" on the memory element 41ac is carried out in exactly the same manner except for connecting the switch 45b instead of the switch 45a and flowing $I_2$ as shown on the right of FIG. 6.

Figure 7:
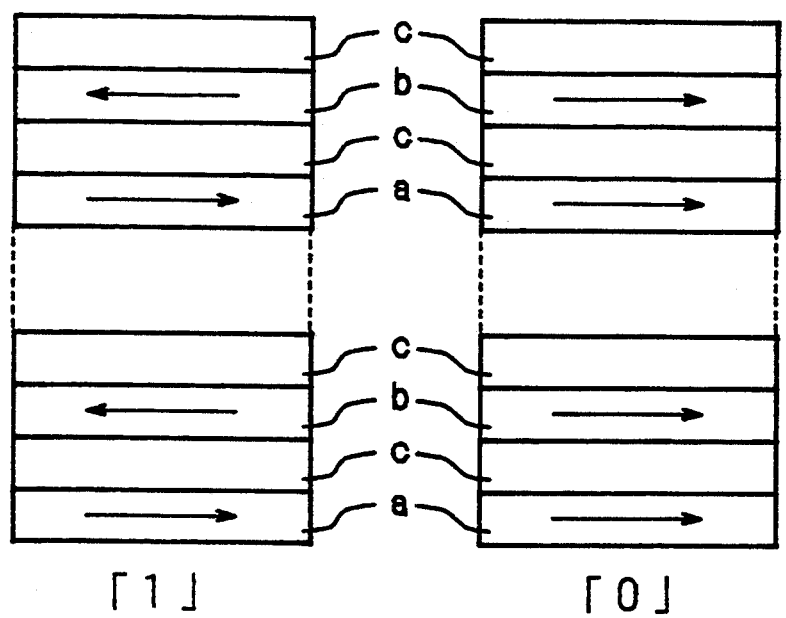
FIG. 7 is a sectional view showing the magnetization state of the magnetic thin film.

FIG. 7 is a sectional view of the memory element in the state of "0" and "1" recorded as described above. Magnetization directions of the magnetic layer a and the magnetic layer b of the memory element 41ac are magnetized in the parallel directions for "0" and magnetized in the anti-parallel directions for "1".

Recording on the memory elements other than the memory element 41ac can be done similarly.

Because recording can be done as described above, the space between the recording line and the memory element can be made as narrow as 2000Å to 5000Å and the recording line can be installed immediately above or below the memory element. Consequently the space for recording line which is necessary for a memory device of recording data by means of perpendicular magnetic field can be eliminated, thereby achieving higher packaging density owing to reduced the space requirement.

Before describing the method of reproduction, the magnetic thin film used in the memory element of the invention will be described below. The magnetic thin film was made by an multilayer film formed by repetitively laminating a magnetic layer a of a higher coercive force and a magnetic layer b of a lower coercive force via a non-magnetic layer c in a manner as a/c/b/c/a/c/b/c . . . .

Figure 8A:
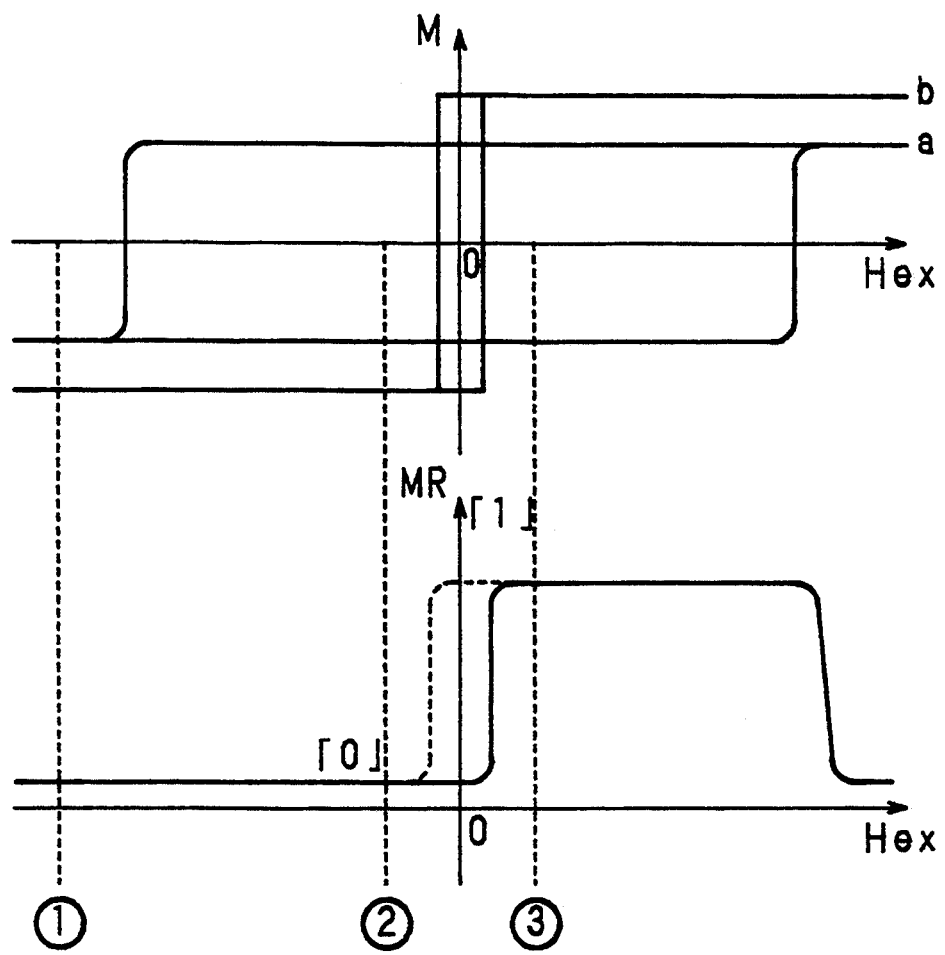
FIG. 8(a) is a conceptual view showing the magnetic properties and resistance changes of the magnetic thin film used in the invention.
Figure 8B:
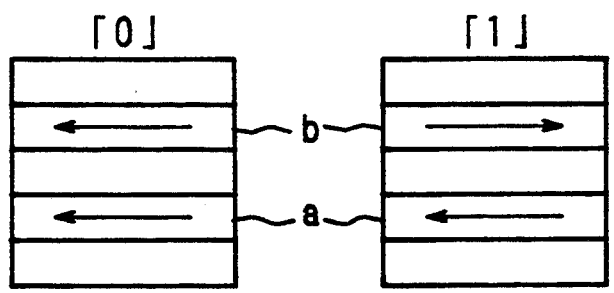
FIG. 8(b) is a conceptual view showing the magnetic properties and resistance changes of the magnetic thin film used in the invention.

FIG. 8(a) shows changes in magnetization M of the magnetic layers a and b in response to the external magnetic field Hex and changes in resistance MR of the multilayer film in response to the external magnetic field in contrast. When a magnetic field is applied up to point (1) in FIG. 8(a), directions of magnetization of the magnetic layers a and b become parallel, for example, to left as shown in FIG. 8(b). Even though the intensity of the magnetic field increases from this state through point (2) to zero, directions of magnetization of the magnetic layers a and b remain parallel to the left. When the applied magnetic field changes to point (3) of the opposite direction, only the magnetization direction of the magnetic layer b is reversed so that the directions of magnetization of the magnetic layers a and b become antiparallel with the resistance increasing at the same time. Even though the magnetic field is reduced from this state to zero, the magnetization directions of the magnetic layers a and b remain antiparallel. Then when the applied magnetic field is reduced to point (2), the magnetization direction of the magnetic layer b is reversed again, so that the magnetization directions of the magnetic layers a and b become parallel once again with the resistance reducing to the original value.

As described above, the magnetization directions of the magnetic layers a and b can be made parallel or antiparallel under the magnetic field of zero, by changing the magnetic fields in a range from point (2) to point (3). By designating the state of the parallel magnetization directions of the magnetic layers a and b as "0" and the antiparallel state as "1", binary digital information can be recorded. Further because the resistance varies depending on whether the magnetization directions of the magnetic layers a and b are parallel or antiparallel, converting the state of the magnetization directions into voltage enables it to discriminate "0" and "1" under the external magnetic field of zero.

Now the method of reproduction by using the artificial lattice thin film will be described below. When reading information from the memory element 1ac in FIG. 2, for example, switches 2a, 3c, 6a and 6b are closed, which causes à current to flow only in the memory element 1ac from up to down of FIG. 2. By measuring the voltage between $\alpha$ and $\beta$ in this state, a voltage $V_A$ in the case where the magnetization directions of the layers a and b of the memory element 1ac are parallel or a voltage $V_B$ in the case where the magnetization directions are antiparallel can be detected as a reproduction output. Since the voltage $V_A$ and the voltage $V_B$ have a difference not less than 5% even when considering the resistance of the wiring, whether the magnetization directions are parallel ("0") or antiparallel ("1") can be determined by checking the reproduction output to see if it is greater than or less than a critical voltage determined at a proper level.

Reading information from the memory element 41ac in FIG. 5 can be done similarly, by closing the switches 42a, 43c, 46a and 46b. This causes current to flow in the memory element 41ac from up to down of FIG. 4. By measuring the voltage between $\alpha$ and $\beta$ in this state, a voltage $V_A$ in the case where the magnetization directions of the layers a and b of the memory element 41ac are parallel or a voltage $V_B$ in the case where the magnetization directions are antiparallel can be detected as a reproduction output. Since the voltage $V_A$ and the voltage $V_B$ have a difference not less than 5% even when considering the resistance of the wiring, whether the directions of magnetization is parallel ("0") or antiparallel ("1") can be determined by checking the reproduction output to see if it is greater than or less than a critical voltage determined at a proper level.

Figure 9:
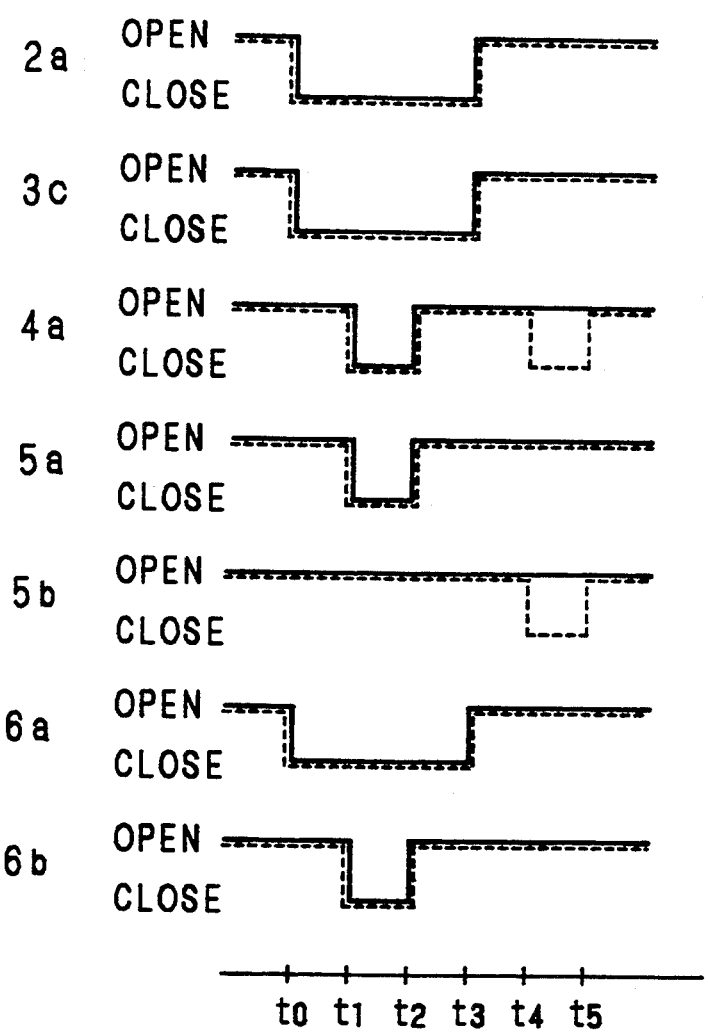
FIG. 9 is a timing chart of the switching operation of the magnetic thin film memory element 1ac in reproducing information.

Other method of reproduction can be done by utilizing the change in magnetization during reproduction. FIG. 9 is a timing chart of the switching operation when reading the recorded state of the memory element 1ac in FIG. 2, which shows the initial magnetization direction of element 1ac, wherein the solid line illustrates downward ("1") direction and the dotted line illustrates the upward ("0") direction. Switches not cited in the chart are all open. In a period from t0 to t3, switches 2a, 3c and 6a are closed with the memory element 1ac being in the state of reproduction, and a bias magnetic field is applied in the lateral direction of the drawing. In a period from t1 to t2, switches 4a, 5a and 6b are all closed, and a magnetic field is applied to the memory element 1ac downward of the drawing.

If the initial magnetization of the element is downward, the magnetization direction is not changed by the magnetic field, and therefore data "1" is reproduced. On the other hand, when the initial magnetization is upward of the drawing, the magnetization direction is reversed to downward of the drawing in a period from t1 to t2 when a magnetic field of intensity not less than the coercive force Hcb is applied. This magnetization reversal is detected as a reproduction signal so that data "0" is reproduced. However, when data "0" is reproduced, the magnetization direction must be returned to the state prior to the reproduction, because the magnetization direction upward of the drawing prior to the reproduction is reversed. The above is the reason for closing the switches 4a and 5b in a period from t4 to t5 when a change in the reproduction signal is observed in the period from t1 to t3. A similar method of reproduction can be also taken in FIG. 5.

EMBODIMENT 1

A concrete example of the above-mentioned magnetic thin film will be described below together with the manufacturing method.

The magnetic thin film constituting the memory element is made of an multi-layer film formed by repetitively laminating a magnetic layer a of a higher coercive force and a magnetic layer b of a lower coercive force via a nonmagnetic layer c in a manner as a/c/b/-c/a/c/b/c . . . . The magnetic layer a is made of a Ni-CoPt alloy (referred to NiCoPt hereinafter), the magnetic layer b is made of a NiFe alloy (referred to NiFe hereinafter). The nonmagnetic layer c is made of Cu. As a method of forming the film, DC magnetron sputtering is employed. In the sputtering apparatus, three targets of NiFe, NiCoPt and Cu are disposed in one chamber. As a substrate, a Si substrate covered by an insulator film of $SiO_2$ on the surface is employed. Sputtering was carried out at a pressure of 1 to 8 mmTorr and a film forming rate of about 30Å per minute. Layers of Ni-CoPt/Cu/NiFe/Cu are repetitively laminated 15 cycles to make an multilayer film with a total thickness of about 3000Å.

Figure 11A:
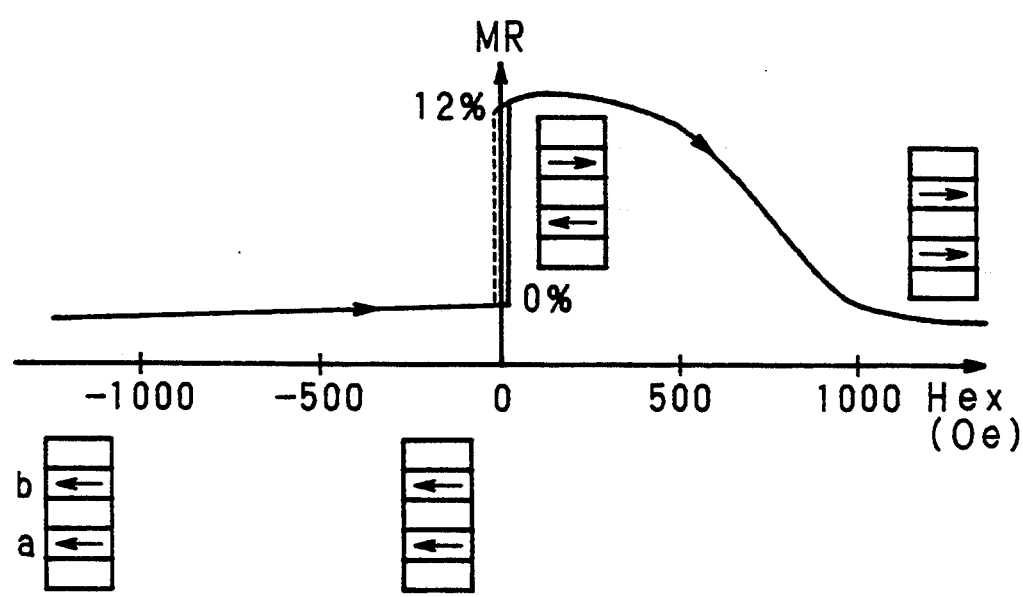
FIGS. 11(a) and 11(b) shown changes in resistance of the magnetic thin film used in Embodiment 1.
Figure 11B:
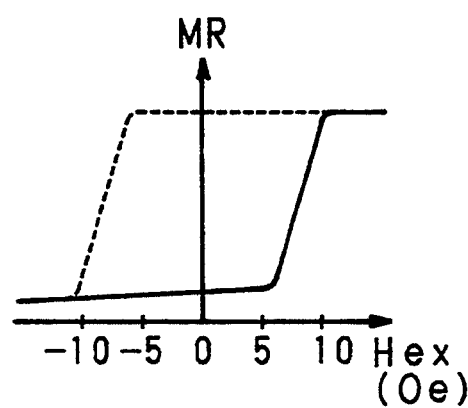
Figure 12:
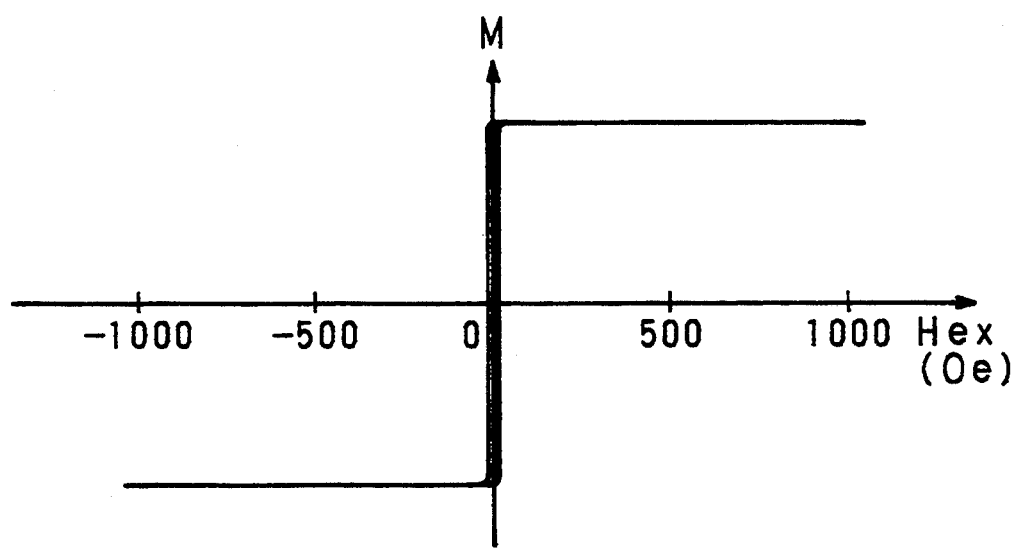
FIG. 12 is a graph showing the hysteresis loop of a NiFe/Cu laminated film.
Figure 13:
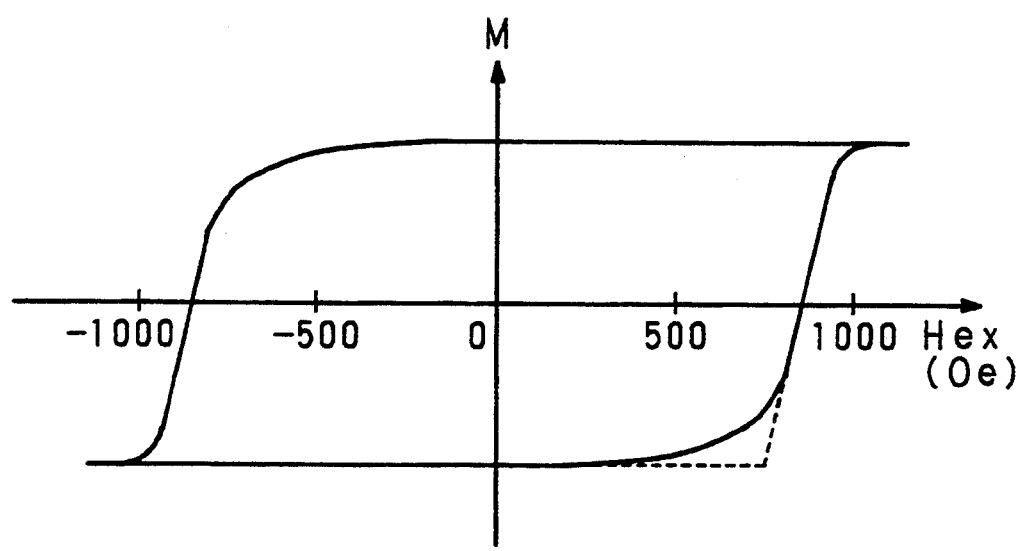
FIG. 13 is a graph showing the hysteresis loop of a NiCoPt/Cu laminated film.
Figure 14:
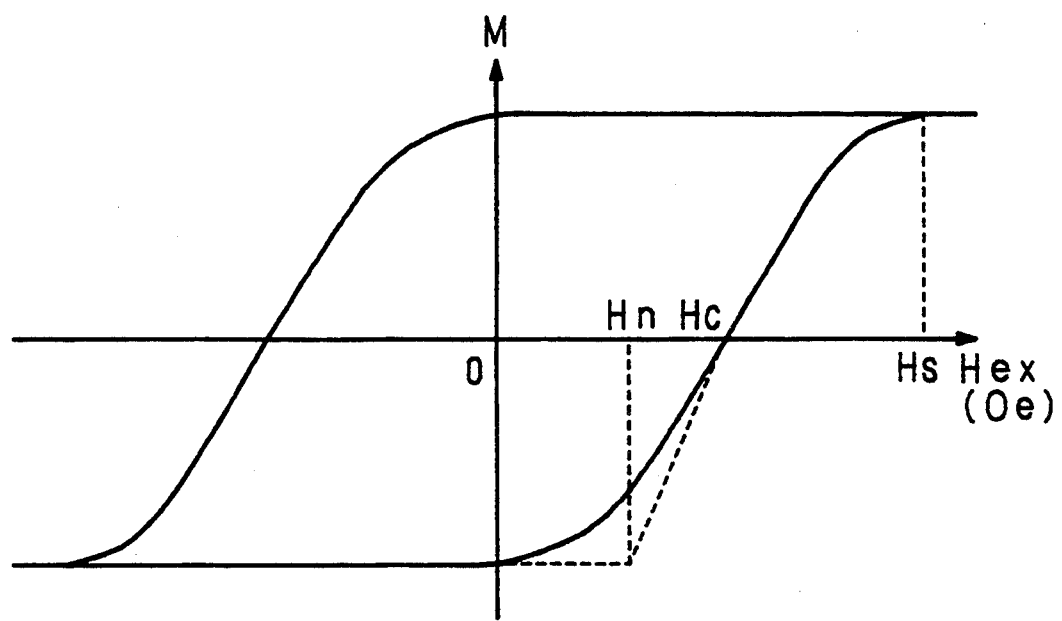
FIG. 14 is a graph explanatory of the definitions of Hn, Hc and Hs.

A typical hysteresis loop and an MR curve of a magnetic thin film manufactured as above are shown in FIGS. 10(a) and 10(b) and FIGS. 11(a) and 11(b). FIG. 10(a) is the hysteresis loop when an exterior magnetic field being applied in the horizontal direction, where an intensity of the exterior magnetic field Hex (Oe) is plotted in the abscissa and the change in magnetization M in the ordinate. FIG. 10(b) is a magnification of the curve in FIG. 10(a) in the abscissa direction around the origin. FIG. 11(a) is the curve of change in the magnetization resistance MR in when the exterior magnetic field Hex being applied in the horizontal direction, and the change in the magnetization direction of each layer due to the applied magnetic field. FIG. 11(b) is a magnification of the curve in FIG. 11(a) in the abscissa direction around the origin. The hysteresis loop shows twostep changes, with the change at around 6 Oe in the first step indicating the magnetization reversal of the magnetic layer b and the change at around 850 Oe in the second step indicating the magnetization reversal of the magnetic layer a. The change in the first step saturates at 10 Oe. The MR curve indicates that the resistance also starts to increase at around 6 Oe and saturates at around 10 Oe. This behavior shows a great agreement with the magnetization reversal of the magnetic layer b. The resistance which increases at around 10 Oe is maintained For some time even when a further magnetic field is applied, and is maintained even after the magnetic field was reduced to zero, showing a change rate of 12% relative to the resistance before applying the magnetic field. This observation shows that the multilayer film of (NiCoPt/Cu/NiFe/Cu)×15 enables it to record information by applying a magnetic field of not less than 10 Oe. FIG. 12 and FIG. 13 show the hysteresis loops where the external magnetic field Hex is plotted in the abscissa and magnetization M in the ordinate, of an multilayer film made of NiFe/Cu or NiCoPt/Cu in order to study the hysteresis loops of NiFe/Cu and NiCoPt/Cu independently. In order to minimize the magnetic interference between the magnetic layers, Cu layers are made with a sufficient thickness of about 300Å. A magnetic field intensity at the rise-up of the hysteresis loop (i.e., a magnetic field intensity For causing the magnetization to start to reverse), a coercive force and a saturation magnetic field, denoted as Hn, Hc and Hs, respectively, are defined as shown in FIG. 14. Values of Hn, Hc and Hs obtained from FIG. 12 and FIG. 13 are summarized in Table 1.

TABLE 1

|  | Hn | Hc | Hs Unit: Oe |
|---|---|---|---|
| NiFe | 6 | 8 | 10 |
| NiCoPt | 750 | 850 | 1020 |

As can be seen from Table 1, Hn of the NiCoPt layer is sufficiently greater than Hs of the NiFe layer with a difference not less than 700 Oe. The change in the MR. curve is steep because the magnetization direction of the NiCoPt layer hardly changes in the region of the magnetic field where the magnetization direction of the NiFe layer is reversed, as described above.

Figure 16:
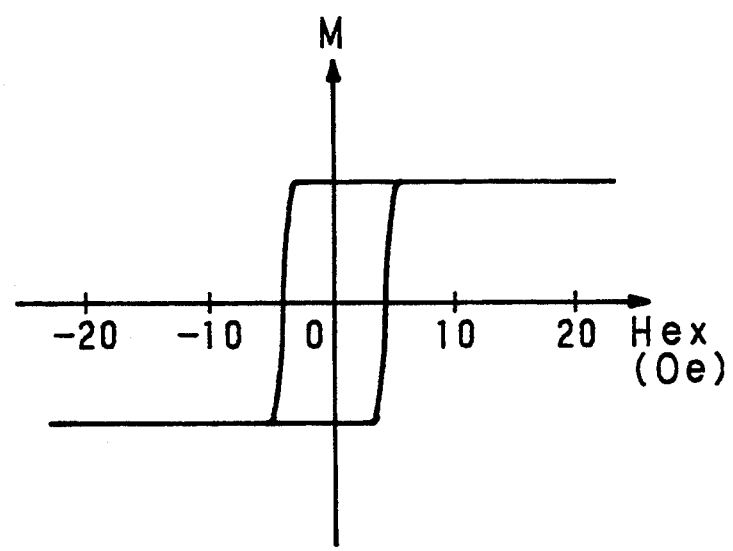
FIG. 16 is a graph showing the hysteresis loop of the magnetic thin film used in Embodiment 1 when an external magnetic field of ±20 Oe is applied thereto in the same direction as in FIG. 15 while a magnetic field of 6

FIG. 15 is a hysteresis loop which shows the change of magnetization M when an external magnetic field Hex of ±20 Oe is applied to the multilayer film. FIG. 16 is a hysteresis loop which shows the change of magnetization M when an external magnetic field Hex of ±20 Oe is applied in the same direction as that in FIG. 15 by keeping to apply a constant magnetic field of 6 Oe in the perpendicular direction to that in FIG. 15. While an external magnetic field of 10 Oe is required to reverse the magnetization in the case of FIG. 15, an external magnetic field of 5 Oe is required in the case of FIG. 16. This means that information can be recorded only to the memory element 1ac by controlling the magnetic field generated by the recording line from 5 Oe to 6 Oe after controlling the magnetic field generated by the reproduction line shown in FIG. 2 at 6 Oe. Reproduction can be done by the same method as described previously. Thus a memory device as shown in FIG. 2 can be made from the multi-layer film of (NiCoPt/Cu/NiFe/-Cu)×15.

COMPARATIVE EXAMPLE 1

Another example of a magnetic thin film above will be described below.

The magnetic thin film constituting the memory element is made of an multilayer film formed by repetitively laminating a magnetic layer a of a higher coercive force and a magnetic layer b of a lower coercive force via a nonmagnetic layer c in a manner as a/c/b/-c/a/c/b/c . . . . The magnetic layer a was made of NiCoPt in Embodiment 1, for example, the magnetic layer b is made of NiFe, and the nonmagnetic layer c is made of Cu. The hysteresis loop and MR curve of the magnetic layer a which is made of Co instead of NiCoPt are shown in FIG. 17 and FIG. 18. FIG. 17 is a hysteresis loop of change in magnetization H when an external magnetic field Hex is applied in the horizontal direction similar to FIG. 10. FIG. 18 shows the MR curve of the change in magnetic resistance MR when the external magnetic field Hex being applied in the horizontal direction similar to FIG. 11 and shows the change of the magnetization direction in each layer due to the applied magnetic field. The film was formed in the same process as that in Embodiment 1.

The hysteresis loop shows two-step changes, with the first change around 5 Oe indicating the magnetization reversal of the magnetic layer b and the change around 300 Oe in the second step indicating the magnetization reversal of the magnetic layer a. Both changes are smooth where the first step ends at 10 Oe and the second step saturates at 500 Oe. In the MR curve of FIG. 18, the resistance reaches its peak at around 10 Oe but immediately starts to decrease to saturate at around 500 Oe. This behavior shows a great agreement with the magnetization reversal of the magnetic layers a and b. The resistance which reaches the peak at around 10 Oe is not maintained but decreased a little when the magnetic field is removed, but the change rate relative to the resistance before applying the magnetic field remained 4%. This observation shows that, when the multilayer film of $(Co/Cu/NiFe/Cu) \times 15$ is used, a magnetic field of 10 Oe is required to be applied for recording. FIG. 19 and FIG. 20 show the hysteresis loops where the external magnetic field Hex is plotted in the abscissa and magnetization M in the ordinate, of an multilayer film made of NiFe/Cu or Co/Cu in order to study the hysteresis loops of NiFe/Cu and Co/Cu independently. In order to minimize the magnetic interference between the magnetic layers, Cu layers are made with a sufficient thickness of about 300Å. A magnetic field intensity at the rise-up of the hysteresis loop, a coercive force and a saturation magnetic field, denoted as Hn, Hc and Hs, respectively, are defined as shown in FIG. 14. Values of Hn, Hc and Hs obtained from FIG. 19 and FIG. 20 are summarized in Table 2.

TABLE 2

|  | Hn | Hc | Hs |
|---|---|---|---|
|  |  |  | Unit: Oe |
| NiFe | 6 | 8 | 10 |
| Co | 50 | 200 | 520 |

As can be seen from Table 2, Hn of the Co layer is greater than Hs of the NiFe layer by only 40 Oe. As shown in FIG. 20, the magnetization of the Co layer begins to reverse from the point of a magnetic field less than Hn, and gradually changes at the magnetic field where the magnetization of the NiFe layer reverses so that the MR curve becomes less steep. If the magnetization of the layer of the higher coercive force has already started to reverse at a magnetic field where the magnetization of the layer of the lower coercive force reverses, it is not desirable because the MR curve is less steep, even when Hn of the layer of the higher coercive force is not less than Hs of the layer of lower coercive force.

FIG. 21 shows the portion enlarged around the external magnetic field of $\pm 20$ Oe in FIG. 18. In FIG. 21, the MR curve is gentle and the change begins before the magnetic field intensity reaches zero. FIG. 22 is a hysteresis loop which shows the change of magnetization M when an external magnetic field Hex of $\pm 20$ Oe is applied to the multilayer film. FIG. 23 is a hysteresis loop which shows the change of magnetization M when an external magnetic field Hex of $\pm 20$ Oe is applied in the same direction as that in FIG. 22 by applying a constant magnetic field of 6 Oe in the perpendicular direction to that in FIG. 22. FIG. 22 shows a great, agreement with FIG. 21, and the magnetization reversal is gradual also in FIG. 23. Thus it becomes impossible to record only on the memory element 1ac, for example, in FIG. 2 as in Embodiment 1 by choosing a particular magnetic field.

As described above, it was not possible to make a memory device as shown in FIG. 2 even when applying an multilayer film of $(Co/Cu/NiFe/Cu) \times 15$.

EMBODIMENT 2

Another example of such a magnetic thin film will be described below.

The magnetic thin film constituting the memory element is made of an multilayer film formed by repetitively laminating a magnetic layer a of a higher coercive force and a magnetic layer b of a lower coercive force via a nonmagnetic layer c in a manner as a/c/b/-c/a/c/b/c .... In Embodiment 1, the magnetic layer a is made of NiCoPt, the magnetic layer b is made of NiFe, and the nonmagnetic layer c is made of Cu, for example. The hysteresis loop and MR curve of the multi-layer film in the case where an undercoat of Cr with a thickness of 500521 is formed on the substrate before forming the multilayer film are shown in FIGS. 24(a) and 24(b) and FIGS. 25(a) and 25(b) similarly to FIG. 10 and FIG. 11. FIG. 24(a) shows the hysteresis loop when an external magnetic field is applied in the horizontal direction, and FIG. 24(b) is a magnification of the curve of FIG. 24(a) in the abscissa direction around the origin, and FIG. 25(a) shows the MR curve and the change of magnetization direction in each layer caused by the applied magnetic field when the external magnetic field Hex is applied in the horizontal direction. FIG. 25(b) is a magnification of the curve of FIG. 25(a) in the abscissa direction around the origin. In the producing steps of the film, making the Cr layer by sputtering in the first place, then forming the magnetic layers similarly to Embodiment 1.

The hysteresis loop shows two-step changes, with the change in the first step at around 5 Oe indicating the magnetization reversal of the magnetic layer b and the change in the second step at around 1200 Oe indicating the magnetization reversal of the magnetic layer a. This means that the undercoat of Cr makes the C axis of the NiCoPt layer easier to be oriented to the horizontal direction thereby increasing the coercive force of the layer a to be greater than that in Embodiment 1. The change in the first step saturates at 7 Oe. The MR curve shows that the resistance begins to increase at around 5 Oe and saturates at around 7 Oe. This behavior shows a great agreement with the magnetization reversal of the magnetic layer b. The resistance which reached the peak at around 7 Oe is maintained for some time even when a further magnetic field is applied, and is maintained after the magnetic field is reduced to zero, showing the change rate of 18% relative to the resistance before applying the magnetic field. When magnetic field of the opposite direction is applied, the resistance begins to decrease at around $-3$ Oe and returns to the initial value at around $-5$ Oe. This indicates that, when using the multilayer film of $Cr/(NiCoPt/Cu/NiFe/-Cu) \times 15$, information can be recorded with a magnetic field being applied of not less than 7 Oe. FIG. 27 is a hysteresis loop which shows the change of magnetization M when an external magnetic field Hex of $\pm 20$ Oe is applied to the multilayer film. FIG. 27 is a hysteresis loop which shows the change of magnetization M when an external magnetic field Hex of ±20 Oe is applied in the same direction as that in FIG. 26 by keeping to apply a constant magnetic field of 4 Oe in the perpendicular direction to that in FIG. 26. While external magnetic fields of +7 Oe and −5 Oe are required to reverse the magnetization in the case of FIG. 26, external magnetic fields of +4 Oe and −2 Oe are required in the case of FIG. 27. This means that information can be recorded only to the memory element 1ac by controlling the magnetic field generated due to $+V_2$ application by the recording line from 4 Oe to 5 Oe and also controlling the magnetic field generated due to $-V_2$ application by the recording line from −2 Oe to 3 Oe, after controlling the magnetic field generated by the reproduction line shown in FIG. 2 at 4 Oe. Reproduction can be done by the same method as described previously.

As described above, recording voltage can be reduced if the magnetic thin film memory is manufactured as shown in FIG. 2 by using the multilayer film of Cr/(NiCoPt/Cu/NiFe/Cu)×15.

EMBODIMENT 3

Further another embodiment of such a magnetic thin film will be described below.

The magnetic thin film constituting the memory element is made of an multilayer film formed by repetitively laminating a magnetic layer a of a higher coercive force and a magnetic layer b of a lower coercive force via a nonmagnetic layer c in a manner as a/c/b/c/a/c/b/c . . . . While in embodiment 2, Cr is used for the buffer layer, NiCoPt is used for the magnetic layer a, NiFe is used for the magnetic layer b and Cu is used for the nonmagnetic layer c, for example, NiCoTa alloy (referred to NiCoTa hereinafter), NiCoCr alloy (referred to NiCoCr hereinafter), NiCoZr alloy (referred to NiCoZr hereinafter), NiCo alloy (referred to NiCo hereinafter) are used instead of NiCoPt for the magnetic layer a. Film forming process is similar to that of Embodiment 1.

The hysteresis loop shows two-step changes similar to Embodiment 2. The change in the first step which indicates the magnetization reversal of the magnetic layer b occurs at around 5 Oe in all cases of NiCoTa, NiCoCr, NiCoZr and NiCo. The change in the second step which indicates the magnetization reversal of the magnetic layer a occurs at 900 Oe with NiCoTa, at 600 Oe with NiCoCr, at 800 Oe with NiCoZr and at around 350 Oe with NiCo. The change in the first step saturates at 7 Oe in every case. The MR curve indicates that the resistance also begins to increase at around 5 Oe and saturates at around 7 Oe. This behavior shows a great agreement with the magnetization reversal of the magnetic layer b. The resistance which reached its peak at around 7 Oe is maintained for some time after a further magnetic field is applied, and is maintained after the magnetic field is reduced to zero, showing the change rate of 16% with NiCoTa, 15% with NiCoCr, 12% with NiCoZr and 14% with NiCo relative to the resistance before applying the magnetic field. This observation shows that the use of an multilayer film of Cr/(NiCoTa/Cu/NiFe/Cu)×15, of Cr/(NiCoCr/Cu/NiFe/Cu )×15, of Cr/(NiCoZr/Cu/NiFe/Cu)×15, or of Cr/(NiCo/Cu/NiFe/Cu)×15 also enables to record information by applying a magnetic field of an intensity not less than 7 Oe.

The hysteresis loop when an external magnetic field of ±20 Oe is applied to the multilayer film is the same as Embodiment 1. While an external magnetic field of 7 Oe is required when only the external magnetic field of ±20 Oe is applied, an external magnetic field of 4 Oe is required to reverse the magnetization when an external magnetic field of ±20 Oe is applied by keeping to apply a constant magnetic field of 4 Oe in the direction perpendicular to that of the initially applied magnetic field. This means that information can be recorded only to the memory element 1ac by controlling the magnetic field generated by the recording line from 4 Oe to 5 Oe after controlling the magnetic field generated by the reproduction line shown in FIG. 2 at 4 Oe. Reproduction can be done by the same method as described previously.

As described above, a memory device as shown in FIG. 2 made by an multilayer film of Cr/(NiCoTa/Cu/NiFe/Cu)×15, Cr/(NiCoCr/Cu/NiFe/Cu)×15, of Cr/(NiCoZr/Cu/NiFe/Cu)×15, or Cr/(NiCo/Cu/NiFe/Cu)×15 is also capable of recording information with a low voltage.

As for the materials described above, an multilayer film of Cr/NiCoTa, Cr/NiCoCr, Cr/NiCoZr, or Cr/NiCo is also manufactured. The undercoat of Cr is made to a thickness of 500Å, and other Cr layers are made to a sufficient thickness of 300Å in order to minimize the magnetic interference between the magnetic layers. Values of rise-up magnetic field Hn, coercive force Hc and saturation magnetic field Hs of these alloys are summarized in Table 3.

TABLE 3

|  | Hn | Hc | Unit: Oe Hs |
|---|---|---|---|
| NiFe | 6 | 8 | 10 |
| NiCoTa | 720 | 920 | 1100 |
| NiCoCr | 400 | 600 | 780 |
| NiCoZr | 590 | 810 | 930 |
| NiCo | 210 | 350 | 500 |

As can be seen from Table 3, the memory device as shown in FIG. 2 can be manufactured if the difference between Hn of a layer of a higher coercive force and Hs of a layer of a lower coercive force is at least 200 Oe.

EMBODIMENT 4

Further another embodiment of the magnetic thin film will be described below.

The magnetic thin film constituting the memory element is made of an multilayer film formed by repetitively laminating a magnetic layer a of a higher coercive force and a magnetic layer b of a lower coercive force via a nonmagnetic layer c in a manner as a/c/b/c/a/c/b/c . . . . In Embodiment 1, for example, NiCoPt is used for the magnetic layer a, NiFe is used for the magnetic layer b and Cu is used for the nonmagnetic layer c. In this embodiment, NiFeCo alloy (referred to NiFeCo hereinafter) is used instead of NiFe for the magnetic layer a. The film forming process is similar to that of Embodiment 1.

The hysteresis loop shows two-step changes similar to Embodiment 1. The change in the first step which indicates the magnetization reversal of the magnetic layer b at around 5 Oe, while the change in the second step which indicates the magnetization reversal of the magnetic layer a of NiCoPt at around 850 Oe. The change in the first step saturates at 7 Oe. The MR curve indicates that the resistance also begins to increase at around 5 Oe and saturates at around 7 Oe. This behavior shows a great agreement with the magnetization reversal of the magnetic layer b. The resistance which reaches its peak at around 7 Oe is maintained for some time after a further magnetic field is applied, and is maintained after the magnetic field is reduced to zero, showing the change rate of 18% relative to the resistance before applying the magnetic field. This observation shows that the use of an multilayer film of (NiCoPt-/Cu/NiFeCo/Cu)×15 enables it to record information by applying a magnetic field of not less than 7 Oe. The hysteresis loop when an external magnetic field of ±20 Oe is applied to the multilayer film is as same as Embodiment 1. While an external magnetic field of 7 Oe is required when only the external magnetic field of ±20 Oe is applied, an external magnetic field of 4 Oe is required to reverse the magnetization when an external magnetic field of ±20 Oe is applied by keeping to apply a constant magnetic field of 4 Oe in the perpendicular direction to that of the initially applied magnetic field. This means that information can be recorded only to the memory element 1ac by controlling the magnetic field generated by the recording line from 4 Oe to 5 Oe after controlling the magnetic field generated by the reproduction line shown in FIG. 2 at 4 Oe. Reproduction can be done by the same method as described previously.

As described above, a memory device as shown in FIG. 2 could be made by using an multilayer film of (NiCoPt/Cu/NiFeCo/Cu)×15.

An embodiment will now be described below for a magnetic thin film memory wherein the easy magnetization axis lies between the perpendicular direction and horizontal direction of a magnetic thin film, and information is recorded by the magnetization direction of the magnetic thin film and the recorded information is read out according to the Hall voltage.

The above magnetic thin film includes a magnetic thin film with a perpendicular magnetic anisotropy where the easy magnetization axis lies approximately at right, angles to the surface of the magnetic thin film, and a magnetic then film where the easy magnetization axis lies between the perpendicular and horizontal directions other than the perpendicular direction.

As the above magnetic thin film, a thin film having ferrimagnetism may be employed, and particularly a rare earth-transition metal alloy is preferable for such properties that enables to obtain a satisfactory Hall voltage in respect to easily control the characteristics such as Hc.

As for the rare earth element, the lanthanides including Gd, Ho, Tb, Nd, Dy and the like are qualified, and the element including at least either one of Gd and Ho is preferable. As for the transition metal, Fe, Co, Ni or the like may be employed. Consequently, the appropriate rare earth-transition metal alloy is, specifically, GdCo, HoCo, GdFe, GdHoCo, TbHoCo, GdFeCo or the like.

The proportion of transition metal in the alloy is preferably from 70 at % to 85 at % in order to obtain a proper coercive force Hc and saturation magnetization Ms.

The shape and area of the magnetic thin film made of the above-mentioned alloy are not limited but may be varied according to the purpose and application. The film thickness is preferably from 500Å to 500Å.

For a method of forming the magnetic thin film, sputtering may be employed. For a substrate of the magnetic thin film memory onto which a thin film is formed, a Si substrate or a glass substrate covered by an insulator film of SiO$_2$ or SiN$_x$ (x is approximately from 0.7 to 1.5) on the surface thereof is qualified.

As a magnetic thin film where the easy magnetization axis lies between the perpendicular and horizontal directions other than the perpendicular direction to the surface of the magnetic thin film, it is desirable that the angle of the easy magnetization axis to the magnetic thin film surface is from 1° to 70°, preferably from 3° to 30°.

As the above magnetic thin film, a rare earth-transition metal alloy is preferable for such properties that enables to obtain a satisfactory Hall voltage in respect to easily control the characteristics.

As for the rare earth element, the lanthanides including Gd, Nd, Ho, Tb and the like are qualified, and the element Gd, Nd, Ho, Tb or the like is preferable. As for the transition metal, Fe, Co, Ni or the like may be employed. Consequently, the appropriate rare earth-transition metal alloy is, specifically, GdFe, GdNdFe, GdHoFe or the like.

The proportion of transition metal in the alloy is preferably from 60 at % to 90 at %.

The shape and area of the magnetic thin film made of the above-mentioned alloy may be varied according to the purpose and application. The film thickness is preferably from 500Å to 3000Å.

For a method of forming the above magnetic thin film, sputtering such as RF sputtering, DC magnetron sputtering or the like is qualified, the RF sputtering is preferable.

FIG. 28 is a schematic sectional view of a sputtering apparatus used in forming of the magnetic thin film where the easy magnetization axis lies between the perpendicular and horizontal directions. In FIG. 28, a numeral 101 denotes a target and a numeral 102 denotes a substrate. As the target 101, an alloy target made of Gd, Fe, for example, a composite target where Gd chips are disposed on a Fe target or the like is employed. As the substrate 102, the same substrate as the magnetic thin film having a perpendicular magnetic anisotropy is employed. As shown in FIG. 28, the substrate 102 is preferably not positioned immediately above the target 101, and the line connecting the centers of the substrate and target preferably inclines at an angle less than 60° with respect to the substrate surface. Sputtering can be carried out after setting as described above.

A magnetic thin film memory using the magnetic thin film where the easy magnetization axis lies between the perpendicular and horizontal directions will be described below.

While various memories using the magnetic thin film of the invention can be conceived, the basic feature thereof is that a plurality of memory elements are connected by current lines and voltage lines provided for reading data.

The current line and the voltage line preferably cross at right angles with each other for the purpose of efficiently reading out the recorded information.

Specifically, when a current of a specified level is allowed to flow in the memory element which is magnetized in a specified direction, by using the current line, a voltage (Hall voltage) is generated in a direction perpendicular to both directions of the current and the magnetic field as a reproduction signal, this voltage can be used as a read-out signal.

This signal has an amplitude which is more than one order higher than the weak voltage generated by the rotation of magnetization conventionally used, and therefore has a high S/N ratio and high reliability.

Recording data on the magnetic thin film memory may be performed by installing recording lines and flowing currents in the recording lines, thereby magnetizing the magnetic thin film by means of the magnetic fields generated by the currents.

According to the invention, two recording lines are installed in either of the two following manners, for example.

The one is to install a recording line X in parallel to the voltage line and another recording line Y in parallel with the current line out of the memory element surface, and the other is to install two recording lines above or below the memory element surface.

In the first place, an embodiment of the magnetic thin film memory, where a recording line X is installed in parallel to the voltage line and the recording line Y is installed in parallel to the current line, out of the memory element surface, will be described below with reference to FIG. 29 through FIG. 32.

In this case, a magnetic thin film having a perpendicular magnetic anisotropy is used for the magnetic thin film and the recording lines are installed at positions shifted a little from the memory element.

The method of reading out data will be described.

FIG. 29 is a view explanatory of the principle of reading out data in the above magnetic thin film memory.

Referring to FIG. 29, a numeral 3 represents a memory element and each element is referred to by numerals 311–313, 321–323 or 331–333. A current line 18 and a voltage line 19 are mounted to the memory element 3, and orthogonal to each other approximately at the center on the memory element 3.

The reading method from the above magnetic thin film memory is performed as follows.

In order to read information from the memory element 332 which is magnetized downward of the drawing, a current J should be fed to a current line 182 to read the voltage change Vhj of a voltage line 193. Likewise, for reading information from a memory element 313 magnetized upward of the drawing, a current J' should be fed to a current line 183 and the voltage change Vhj' of a voltage line 191 should be read. At this time, the Hall voltages Vhj and Vhj' are reversal, thereby enabling the reading of a signal equivalent to the binary information.

The recording method will be discussed below.

FIG. 30 is a view showing the magnetic thin film memory where recording lines are disposed on the memory of FIG. 29.

Referring to FIG. 30, numerals 6 and 7 denote lateral and vertical recording lines, and orthogonal to each other. The recording lines 6 and 7 are shifted a little from the memory element 3 in order to apply a magnetic field onto the memory element 3 in a perpendicular direction thereto, generated when supplying currents Ix and Iy. For instance, the following description is related to the case of directing the magnetization of the memory element 332 downward of the drawing. If the current Ix is supplied to a lateral recording line 63 in a direction shown by an arrow→, a magnetic field Hix is generated. On the other hand, when the current Iy is supplied to a vertical recording line 72 in a direction shown by an arrow ↑, a magnetic field Hiy is generated. The relation between the change of the Hall voltage and the magnetic field of the memory element 3 is shown in FIG. 31. Supposing that the coercive force of the memory element 3 is Hc, the following relation is held:

$$Hiy < Hc$$
$$Hix < Hc$$
$$Hc < Hix + Hiy$$

In other words, the magnetization of the memory element 3 is not changed by supplying either of the currents Ix or Iy, but is changed to the reverse direction only when both the magnetic fields Hix and Hiy generated by the current Ix and Iy are applied. Areas where both the magnetic fields Hix and Hiy are applied are areas 2 and 4 divided by the recording lines 6, 7 as shown in FIG. 32. When the current Ix is fed in the direction→ and the current Iy is fed in the direction ↑, the magnetic field direction to the area 2 is upward, whereas that to the area 4 is downward. If the direction of each current Ix, Iy is reversed, the direction of the magnetic field to the area 2 is downward, and that to the area 4 is upward.

Accordingly, if the memory element 3 is provided only in the area 4, it is possible to change the magnetization of the memory element 3 to upward or downward by reversing the direction of the currents Ix and Iy. For data "1", the magnetization of the memory element 3 is directed downward by supplying the current Ix in the direction→ and the current Iy in the direction ↑. For data "0", the magnetization direction of the memory element 3 is directed upward by supplying the current Ix in the direction ← and the current Iy in the direction ↓.

Although the above embodiment employs a magnetic thin film having a perpendicular magnetic anisotropy, it is not limited to the magnetic thin film having a perpendicular magnetic anisotropy but any magnetic thin films where the easy magnetization axis lies between the perpendicular and horizontal directions may be used for recording and reading information.

Next an embodiment of a magnetic thin film memory with two recording lines installed above or below memory elements will be described below with reference to FIG. 33 through FIG. 43.

As the magnetic thin film in this case, a magnetic thin film where the easy magnetization axis lies between the perpendicular and horizontal directions other than the perpendicular direction is employed, with the recording lines installed immediately above or below the magnetic thin film via insulator layers.

FIG. 33 is a circuit diagram illustrative of an embodiment of the magnetic thin film memory employing the above mentioned magnetic thin film.

In FIG. 33, a numeral 8 denotes a memory element with suffix added as 8aa, 8ab, . . . , 8cc for indicating each address, which may be omitted if unnecessary to be referred to, to be simply written as 8, the same applying to other numerals. Numerals 9 through 14 are all switching transistors, a numeral 15 denotes a capacitor and a numeral 16 denotes a signal amplifier such as an operational amplifier. Symbols $V_1$, $V_2$ denote positive voltage sources and a symbol GND denotes ground. In the drawing, solid lines denote reproduction lines and dotted lines denote the recording lines.

The memory element 8 is made by a magnetic thin film where the easy magnetization axis lies between the perpendicular and horizontal directions as described above. The magnetic thin film in FIG. 33 is formed in such a manner as the direction of the easy magnetization axis along the horizontal direction inclines to the two recording lines (dotted lines) immediately above or below the memory element at angles of $\theta x$ and $\theta y$, respectively ($\theta x + \theta y = 45°$ in FIG. 33).

The procedure of reading information by utilizing the Hall voltage as a reproduction signal will be described below. In the case of using the above-mentioned magnetic thin film, information is read out by utilizing the phenomenon that the generated voltage is reversed by the reversal of the magnetization direction as shown in FIG. 34 and FIG. 35, which show magnetization of the memory element obliquely upward and downward, respectively. For example, in order to read information from the memory element 8ac in FIG. 33, a switch 9a is closed upon which a current flows in the memory elements 8aa, 8ab and 8ac from up to down of FIG. 33. By measuring the voltages between $\alpha$ and $\beta$ under this state, the magnetization direction of the memory element 8ac is read out.

As another method of reading, a change in the magnetization can be utilized. Since the easy magnetization axis of the magnetic thin film lies between the perpendicular and horizontal directions, the magnetization direction oriented obliquely upward is taken as "0" and the magnetization direction oriented obliquely downward is taken as "1" to correspond to a binary digit. FIG. 36 is a timing chart explanatory of the switching operation when reading the recorded data from the memory element 8ac, which shows the initial magnetization direction of element 8ac, wherein the solid line illustrates an obliquely upward ("0") direction and the dotted line illustrates an obliquely downward ("1") direction. All switches not referred to in the chart are open. First, switches 9a and 10c are closed during a period from $t_0$ to $t_3$ when information is readable from the memory element 8ac. During a period from $t_1$ to $t_2$, switches 11a, 12c and 13 are all closed thereby causing the magnetic field with an intensity of an expression as follows to be applied to the memory element 8ac in the horizontal direction of the easy magnetization axis.

$$-(\text{Hix} \sin\theta x + \text{Hiy} \times \sin\theta y)$$

If the element is initially magnetized obliquely upward, the magnetization direction will not be changed by the magnetic field and therefore data "0" is read out. If the element is initially magnetized obliquely downward, on the other hand, the magnetization is reversed to obliquely upward in the period from $t_1$ to $t_2$ during which the magnetic field with an intensity of an expression as follows which is not less than the coercive force Hc is applied in the horizontal direction of the easy magnetization axis.

$$-(\text{Hix} \sin\theta x + \text{Hiy} \times \sin\theta y)$$

This reversal is detected as the read signal, whereby "1" is read out. However, when "1" is read out, because the magnetization direction initially oriented obliquely downward is reversed, the magnetic field with an intensity of an expression as follows must be applied again in the horizontal direction of the easy magnetization axis to restore the initial state before reading.

$$-(\text{Hix} \sin\theta x + \text{Hiy} \times \sin\theta y)$$

This is the reason for closing the switches 11a, 12c and 14 during a period front $t_4$ to $t_5$ when the change in the read out signal is detected during the period from $t_1$ to $t_3$.

Next, the recording method will be described. Information is recorded by means of the magnetization direction of the magnetic thin film. For example, a procedure of recording "0" on the memory element 8ac, namely magnetizing obliquely upward will be described with reference to FIG. 33 and FIG. 37 through FIG. 43.

In FIG. 33, switches 11a, 11b, 11c, 12a, 12b and 12c are all open when not recording information, and no current flows in the recording lines represented by the dotted lines. In a case of recording information on the memory element 8ac, switches 11a and 12c are closed. Further, in a case of recording "0", the switch 13 is closed.

FIG. 37 shows the state of flowing currents in the recording lines immediately above or below the magnetic thin film of the memory element 8ac in the recording. Numerals 81 and 82 in FIG. 37 denote the recording lines indicated by the dotted lines in FIG. 33. Magnetic fields generated by a current ix flowing in the recording line 81 and a current iy flowing in a the recording line 82 are shown in the drawing as Hix and Hiy.

The relationship between the horizontal direction of the easy magnetization axis of the magnetic thin film element 8 and the currents ix, iy is shown in FIG. 38. In FIG. 38, the horizontal direction of the easy magnetization axis is indicated by a dashed line. As shown in the drawing, the angle of the horizontal direction of the easy magnetization axis to the current ix is denoted as $\theta x$ and the angle to the current iy is denoted as $\theta y$.

The intensity of the magnetic field Hix generated by the current ix to the horizontal direction of the easy magnetization axis is shown in FIG. 39 as (Hix $\times \sin\theta x$), and the intensity of the magnetic field Hiy generated by the current iy to the horizontal direction of the easy magnetization axis is shown in FIG. 40 as (Hiy $\times \sin\theta y$). The magnetic thin film has coercive force Hc to satisfy the following inequalities (4), (5) and (6) against the magnetic field applied to the horizontal direction of the easy magnetization axis, namely, the applied magnetic field parallel to the magnetic thin film surface.

$$\text{Hix} \times \sin\theta x < \text{Hc} \tag{4}$$

$$\text{Hiy} \times \sin\theta x < \text{Hc} \tag{5}$$

$$\text{Hc} < \text{Hix} \times \sin\theta x + \text{Hiy} \times \sin\theta y \tag{6}$$

Consequently, information is not recorded on the memory elements 8ab and 8bc but recorded only on the memory element 8ac where both the current ix and the current iy flow in crossing directions as shown in FIG. 41. In FIG. 41, an arrow in the memory element 8ac indicates the horizontal direction of the magnetization of data "0" being recorded.

Since the easy magnetization axis of the magnetic thin film in the memory of the invention lies between the perpendicular and horizontal directions, the magnetization obliquely upward or obliquely downward is achieved by changing the current iy by the operation described above.

FIG. 42 is a sectional view of the memory element 8ac where data "0" is recorded as above. The magnetization direction of the magnetic thin film is oriented obliquely upward between the perpendicular and horizontal directions, as shown in the drawing.

When recording data "1", referring to FIG. 33, the switch 13 is opened and the switch 14 is closed, instead. FIG. 43 is a sectional view showing the element in this recording state. As shown in the figure, the magnetization direction of the magnetic thin film is obliquely downward between the perpendicular and horizontal directions.

The recording on other memory elements can be done similarly.

The magnetic thin film with the easy magnetization axis lying between the perpendicular and horizontal directions used in the embodiment described above has such magnetic characteristics as below.

FIG. 44 through FIG. 46 show typical Hall hysteresis loops of the magnetic thin film. FIG. 44 shows the Hall hysteresis loop when an external magnetic field is applied in a perpendicular direction. FIG. 45 shows the Hall hysteresis loop when a magnetic field is applied in the horizontal direction of the easy magnetization axis. FIG. 46 shows the Hall hysteresis loop when a magnetic field is applied in the horizontal direction of the hard magnetization axis.

In the thin film magnetic, the Hall voltage is generated equally by both the magnetic field in the perpendicular direction and the magnetic field in the horizontal direction of the easy magnetization axis, and moreover the thin film magnetic has a weak coercive force of about 10 Oe against the magnetic field in the horizontal direction of the easy magnetization axis. When the abovedescribed magnetic thin film is used for the memory, information can be recorded by the horizontal magnetic field, and the Hall voltage can be used as the reproduction signal.

The method of manufacturing the above-mentioned magnetic thin film memory will be depicted hereinafter.

A mask A with rectangular holes (for example, 0.1μm×1.2 μm) is held in tight contact with a glass substrate, as illustrated in FIG. 47. A conductor film of Cu, Au, Al or the like 0.1–1.0 μm thick is formed as reproducing lines through sputtering or the like. Moreover, another mask B with rectangular holes (0.5 μm square) as shown in FIG. 48 is brought in tight contact onto the mask B in a manner that each side of the rectangular hole overlaps one end of the conductor film of Cu, Au, Al or the like. Then, a GdCo film as the magnetic thin film about 500–3000Å thick is formed through sputtering. As a result, each memory element is connected to the reproducing lines as indicated in FIG. 49. A dielectric film of SiNx (x=0.7–1.5) or the like 0.2–0.5 μm thick is formed as a protecting film for the memory element and reproducing lines.

Then, vertical recording lines are formed of Cu, Al, Au or the like onto the SiNx film by sputtering, for example, to be 0.5 μm thick. Further, an SiNx film of 0.2–0.5 μm thick is formed all over the surface, and the lateral recording lines of Cu, Al, Au or the like of 0.5 μm thick are formed. At this time, the vertical and lateral recording lines are formed to be shifted a little from the rectangular memory element, or immediately above the memory element.

The recording lines may be previously formed to be disposed immediately below the memory element if an insulating film is interposed.

Finally, a protective coating of resin is formed.

In the case of installing the recording lines immediately above or below the magnetic thin film, since it is enough that the magnetic thin film and the recording lines are at least insulated, a spacing between the magnetic thin film and the recording lines can be narrowed to be about 2000–5000Å when employing the dielectric film such as SiNx, SiO$_2$ for the insulating layer. Further, the recording lines are installed immediately above or below the magnetic thin film, thereby achieving higher packaging density owing to reduced space requirement.

EMBODIMENT 5

A mask A with rectangular holes (for example, 0.1 μm×1.2 μm) is held in tight contact with a glass substrate, as illustrated in FIG. 47. Reproduction lines of Cu 0.5 μm thick is formed through sputtering. Moreover, another mask B with rectangular holes (0.5 μm square) as shown in FIG. 48 is brought in tight contact onto the mask B in a manner such that each side of the rectangular hole overlaps one end of the reproduction line previously formed. Then, a GdCo film as the magnetic thin film about 2000Å thick is formed through sputtering by applying a bias voltage (−50 V). As a result, each memory element is connected to the reproducing lines as indicated in FIG. 49. A dielectric film of SiNx (x=1.0) 0.1 μm thick is formed as a protecting film for the memory element and reproducing lines.

Then, vertical recording lines of Cu are formed onto the SiNx film by sputtering, to be 0.4μ wide, 0.5 μm thick. Further, an SiNx film 0.1 μm thick is formed all over the surface, and the lateral recording lines of Cu are formed to be 0.4μ wide, 0.5 μm thick. At this time, the vertical and lateral recording lines are formed to be shifted a little from the rectangular memory element.

Finally, a protective coating of resin is formed, thereby obtaining the magnetic thin film memory as shown in FIG. 30.

The coercive force of the GdCo film (Gd:25 at %, Co:75 at %) used as the memory element in Embodiment 5 is 40 Oe, and constant currents Ix, Iy of 15 mA are supplied to the recording lines, respectively.

The pattern cycle is 2 μm, the memory element 3 is 0.5 μm square and the center distance between the recording line and memory element 3 is about 1 μm.

The magnetic field generated by each recording line and applied to the central part of the memory element 3 is approximately 30 Oe. The magnetic force exceeds enough the coercive force 40 Oe of the memory element 3 only when both magnetic fields are superimposed, whereby good recording is achieved.

A voltage of approximately 4.5 mV is impressed to both ends of the memory element 3 through the current line 18. When the magnetization of the memory element 3 is reversed from "0" to "1", the voltage change on the voltage line 19 is about 40 μV which assures good reading operation.

EMBODIMENT 6

By using a mask or the like, similar to Embodiment 5, the following films are formed in the following order on a silicon substrate through sputtering, thereby obtaining the magnetic thin film memory as shown in FIG. 50.

| | |
|---|---|
| Recording line 6 | 0.3 μm wide, 1 μm thick |
| Insulating film | 0.1 μm thick |
| Current line 18 and voltage line 19 | 0.5 μm wide, 0.5 μm thick |
| Memory element | 0.5 μm long, 0.5 μm wide 0.5 μm thick |

-continued

| Insulating film | 0.1 μm thick |
| Recording line 7 | 0.3 μm wide, 1 μm thick |

As a result, a pattern as shown in FIG. 50 is obtained. The memory element 3 is formed of TbHoco film (Tb:7 at %, Ho:19 at %, Co:74 at %) having the easy magnetization axis in a perpendicular direction and the coercive force of 30 Oe.

The pattern cycle is 2 μm, the memory element 3 is 0.5 μm square, and the center distance between the recording lines and memory element 3 is approximately 1 μm. The number of the elements is 1000×1000.

The reading and reproducing methods are similar to Embodiment 5.

A current 10 mA is supplied through the recording lines 6, 7. At this time, the magnetic field generated by each recording line 6, 7 at the central part of the memory element 3 is about 20 Oe. Only when both magnetic fields are superimposed, the magnetic force is fully exceeds the coercive force of the memory element 3, thus realizing good recording.

A voltage of 5 V is impressed to both ends of the current line 18, whereby a current of about 3.5 mV is applied to both ends of each memory element 3. When the magnetization of the memory element 3 is reversed from "0" to "1", the voltage change appearing on the voltage line 19 is about 30 μV. Accordingly, good reading is achieved by sufficiently larger read-out signal than the thermal noise.

EMBODIMENT 7

As shown in FIG. 51, the magnetic thin film memory of the instant embodiment is similar to Embodiment 6, except that recording lines are installed on both sides of the memory element 3. The center-to-center distance between the recording lines on the both sides and the memory element 3 is equal the Embodiment 6. When currents are supplied in reverse directions to the respective recording lines so that the amount of the currents are equal to Embodiment 6, favorable recording is accomplished. More specifically, when directing the magnetization of the memory element 3 marked by a circle in FIG. 51 to be downward for recording, the currents are fed to the four recording lines in the vicinity of the memory element 3 in respective directions shown by arrows. Meanwhile, in order to direct the magnetization of the memory element 3 upward for recording, the currents should be fed in the opposite directions to those shown by the arrows. In this embodiment, half the amount of current is enough to one recording line in comparison with when the recording lines are provided on one side of the memory element 3.

EMBODIMENT 8

A magnetic thin film memory having the same circuitry as shown in FIG. 33, except that the number of the memory elements is different, is used.

The memory element is shaped in a rectangle 0.5 μm square, spaced by 2 μm between adjacent elements and the number of the memory elements is 10×10.

Because supplying a current of 1.3 mA to each of the two recording lines generate an effective magnetic field of 6.2 Oe around each recording line, the magnetic field intensity exceeds 10 Oe only when both of the two recording lines generate the magnetic field to enable recording information. When reading information, the Hall voltage of 1.5 mV is obtained from a current of 1 mA, to generate an output of not less than 100 mV after amplification, whereby satisfactory reading was carried out.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A magnetic thin film memory to record information by a magnetization direction of a magnetic thin film and to read out a recorded information from the magnetic thin film according to a resistance thereof changeable by magneto-resistance effect, said magnetic thin film comprising:
   at least one first magnetic layer;
   at least one second magnetic layer of a lower coercive force than the at least one first magnetic layer; and
   at least one nonmagnetic conductive layer;
   such that the at least one first magnetic layer and the at least one second magnetic layer are laminated interposing one of the at least one nonmagnetic layer between one of the at least one first magnetic layer and one of the at least one second magnetic layer wherein one of the at least one first magnetic layer is followed by one of the at least one nonmagnetic layer followed by one of the at least one second magnetic layer in a repetitive manner.

2. A magnetic thin film memory as set forth in claim 1, wherein information to be recorded corresponds to the magnetization direction of the at least one second magnetic layer.

3. A magnetic thin film memory as set forth in claim 2, wherein the at least one magnetic layer is made of a material with a coercive force to keep the magnetization direction unchanged due to a magnetic field of intensity within a range where the magnetization direction of the at least one second magnetic layer reverses.

4. A magnetic thin film memory as set forth in claim 2, wherein the at least one magnetic layer and the at least one second magnetic layer are made of such materials that the magnetic field intensity at which magnetization direction of the at least one first magnetic layer begins to reverse is greater than that of a saturation magnetic field of the at least one second magnetic layer.

5. A magnetic thin film memory as set forth in claim 4, wherein the magnetic field intensity at which the magnetization direction of the at least one first magnetic layer begins to reverse is greater than the magnetic field intensity at the saturation magnetic field of the at least one second magnetic layer by not less than 200 Oe.

6. A magnetic thin film memory as set forth in claim 1, wherein the at least one magnetic layer is made of a NiCoPt alloy.

7. A magnetic thin film memory as set forth in claim 1, wherein the at least one second magnetic layer is made of a NiFe alloy or a NiFeCo alloy.

8. A magnetic thin film memory as set forth in claim 1, further comprising:
   a buffer layer at the bottom of the laminated layers.

9. A magnetic thin film memory as set forth in claim 8, wherein the buffer layer is made of Cr.

10. A magnetic thin film memory as set forth in claim 9, wherein the at least one first magnetic layer is made of a NiCo alloy or of a NiCoM (M=Pt, Ta, Cr or Zr) alloy.

11. A method of recording information on a magnetic thin film memory of claim 1, said method comprising recording information in such a manner as to correspond to the magnetization direction of the at least one second magnetic layer.

12. A magnetic thin film memory comprising:
- a magnetic thin film having a magnetic anisotropy such that the direction of an easy magnetization axis lies between the horizontal and the perpendicular directions with respect to a film plane excluding the perpendicular direction and data to be recorded corresponds to the magnetization direction thereof;
- two recording lines insulated from the magnetic thin film for supplying currents to apply magnetic fields in the directions parallel to the surface of the magnetic thin film and perpendicular to each other for recording information; and
- means for reproducing information by utilizing the anomalous Hall effect of the magnetic thin film.

13. A magnetic thin film memory as set forth in claim 12, wherein the magnetic thin film is made of a ferrimagnetic film.

14. A magnetic thin film memory as set forth in claim 13, wherein the ferrimagnetic film is made of a rare earth-transition metal alloy.

15. A magnetic thin film memory as set forth in claim 14, wherein the rare earth alloy is selected from at least one of a group of lanthanides.

16. A magnetic thin film memory as set forth in claim 15, wherein the group of lanthanides consists of gadolinium, holmium, terbium, neodymium, and dysprosium.

17. A magnetic thin film memory as set forth in claim 12, wherein the recording lines are provided immediately above or below the magnetic thin film.

18. A method of recording information on the magnetic thin film memory of claim 17, comprising:
supplying currents to the two recording lines to satisfy inequalities:

$$Hix \cdot \sin\theta x < Hc$$
$$Hiy \cdot \sin\theta y < Hc$$
$$(Hix \cdot \sin\theta x) + (Hiy \cdot \sin\theta y) > Hc$$

wherein $\theta x$, $\theta y$ are angles of the two recording lines x, y from the easy magnetization axis of the magnetic thin film in the horizontal direction to the film plane, Hix, Hiy are magnetic field intensities respectively applied to the magnetic thin film by the two recording lines, and Hc is the coercive force against the magnetic field applied in the horizontal direction of the magnetic thin film.

19. A magnetic thin film memory as set forth in claim 12, wherein the angle of the easy magnetization axis from the surface of the magnetic thin film is within a range from 1° to 70°.

* * * * *